United States Patent
Furuhashi et al.

(10) Patent No.: US 7,166,516 B2
(45) Date of Patent: Jan. 23, 2007

(54) METHOD FOR FABRICATING A SEMICONDUCTOR DEVICE INCLUDING THE USE OF A COMPOUND CONTAINING SILICON AND NITROGEN TO FORM AN INSULATION FILM OF SIN OR SICN

(75) Inventors: Masayuki Furuhashi, Kawasaki (JP); Toshifumi Mori, Kawasaki (JP); Young Suk Kim, Kawasaki (JP); Takayuki Ohba, Kawasaki (JP); Ryou Nakamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/696,775

(22) Filed: Oct. 30, 2003

(65) Prior Publication Data

US 2004/0132257 A1    Jul. 8, 2004

(30) Foreign Application Priority Data

Oct. 31, 2002  (JP)  ............... 2002-317456

(51) Int. Cl.
*H01L 21/471*  (2006.01)
*C23C 16/34*  (2006.01)
*C23C 16/36*  (2006.01)

(52) U.S. Cl. ............ 438/301; 438/303; 438/675; 438/786; 438/791; 427/255.27; 427/255.394

(58) Field of Classification Search ............ 438/301, 438/303, 675, 786, 791; 427/249.15, 255.27, 427/255.28, 255.393, 25.394

See application file for complete search history.

(56) References Cited

U.S. PATENT DOCUMENTS 5,874,368 A * 2/1999 Laxman et al. ............. 438/794

(Continued)

FOREIGN PATENT DOCUMENTS

JP           11-172439           6/1999

(Continued)

OTHER PUBLICATIONS

William A. Brown et al., Solid State Technology/ Jul. 1979, pp. 51-57,84(1979).

(Continued)

*Primary Examiner*—Stephen W. Smoot
(74) *Attorney, Agent, or Firm*—Westerman, Hattori, Daniels & Adrian, LLP.

(57) ABSTRACT

The semiconductor device fabrication method comprises the step of forming gate electrode 20 on a semiconductor substrate 10 with a gate insulation film 18 formed therebetween; the step of implanting dopants in the semiconductor substrate 10 with the gate electrode 20 as the mask to form dopant diffused regions 28, 36; the step of forming a silicon oxide film 38 on the semiconductor substrate 10, covering the gate electrodes 20; anisotropically etching the silicon oxide film 38 to form sidewall spacers 42 including the silicon oxide film 38 on the side walls of the gate electrode 20. In the step of forming a silicon oxide film 38, the silicon oxide film 38 is formed by thermal CVD at a 500–580° C. film forming temperature, using bis(tertiary-butylamino) silane and oxygen as raw materials. Silicon oxide film 38 is formed at a relatively low film forming temperature, whereby the diffusion of the dopant in the doapnt diffused regions 28, 36 forming the shallow region of the extension source/drain structure can be suppressed.

15 Claims, 33 Drawing Sheets

U.S. PATENT DOCUMENTS

| | | | |
|---|---|---|---|
| 6,077,769 A * | 6/2000 | Huang et al. | 438/622 |
| 6,153,261 A * | 11/2000 | Xia et al. | 427/255.393 |
| 6,462,371 B1 * | 10/2002 | Weimer et al. | 257/306 |
| 6,677,201 B1 * | 1/2004 | Bu et al. | 438/257 |
| 6,716,772 B1 * | 4/2004 | Mizuno et al. | 438/794 |
| 2002/0090835 A1 * | 7/2002 | Chakravarti et al. | 438/794 |
| 2002/0111039 A1 * | 8/2002 | Moore | 438/778 |
| 2002/0151145 A1 * | 10/2002 | Lee et al. | 438/303 |
| 2003/0059535 A1 * | 3/2003 | Luo et al. | 427/255.28 |
| 2003/0102512 A1 * | 6/2003 | Chatterjee | 257/370 |
| 2004/0033677 A1 * | 2/2004 | Arghavani et al. | 438/510 |

FOREIGN PATENT DOCUMENTS

| | | |
|---|---|---|
| JP | 2000-77403 | 3/2000 |
| JP | 2001-156063 | 6/2001 |
| JP | 2001-156065 | 6/2001 |

OTHER PUBLICATIONS

David E. Kotecki et al., Journal of Applied Physics 77(3), pp. 1284-1293 (1995).

* cited by examiner

METHOD FOR FABRICATING A SEMICONDUCTOR DEVICE INCLUDING THE USE OF A COMPOUND CONTAINING SILICON AND NITROGEN TO FORM AN INSULATION FILM OF SIN OR SICN

CROSS-REFERENCE TO RELATED APPLICATION

This application is based upon and claims priority of Japanese Patent Application No. 2002-317456, filed on Oct. 31, 2002, the contents being incorporated herein by reference.

BACKGROUND OF THE INVENTION

The present invention relates to a semiconductor device fabrication method.

Shorter channel lengths accompanying increasing micronization of semiconductor devices makes the short channel effect conspicuous. This makes it impossible for MOS transistors to normally operate. As a technique of preventing the short channel effect, semiconductor devices having the extension source/drain structure are recently noted.

In the method for fabricating the semiconductor devices having the extension source/drain structure, a dopant is implanted shallow in a semiconductor substrate with a gate electrode as the mask to thereby form a shallow dopant diffused region, i.e., an extension region, then a sidewall spacer is formed on the side wall of the gate electrode, and then a dopant is implanted in the semiconductor substrate with the gate electrode and the sidewall spacer as the mask to thereby form a deeply dopant diffused region.

It is important that the shallow dopant diffused region, i.e., the extension region has low electric resistance and transversely acute dopant profile. That is, it is important that a dopant is diffused as little as possible in the shallow dopant diffused region.

In forming silicon oxide film forming the sidewall spacer, conventionally the silicon oxide film is formed by, e.g., low pressure thermal CVD at a deposition temperature of, e.g., 620° C., using, e.g., TEOS and $O_2$ as the raw materials.

In forming silicon nitride film forming the sidewall spacer, conventionally the silicon oxide film is formed by, e.g., low pressure thermal CVD at a deposition temperature of, e.g., 700–800° C., using, e.g., DCS (Di-Chloro-Silane ($SiH_2Cl_2$) and $NH_3$ as raw materials.

The silicon oxide film and the silicon nitride film have been formed at such high temperatures, because it has been considered that unless the silicon oxide film and the silicon nitride film are formed at such high temperatures, they cannot have good quality. Film forming temperature for forming silicon nitride film of good quality is described in, e.g., Patent Reference 1.

Following references disclose the background art of the present invention.

[Patent Reference 1]
Specification of Japanese Patent Application Unexamined Publication No. 2000-77403
[Patent Reference 2]
Specification of Japanese Patent Application Unexamined Publication No. Hei 11-172439
[Patent Reference 3]
Specification of Japanese Patent Application Unexamined Publication No. 2001-156065
[Patent Reference 4]
Specification of Japanese Patent Application Unexamined Publication No. 2001-156063
[Non-Patent Reference 1]
Brown, W. A. et al.: Solid State Technology/July 1979, p. 51 (1979)
[Non-Patent Reference 2]
David, E. K. et al.: Journal of Applied Physics 77(3), p. 1284 (1995)

However, when the silicon oxide film and silicon nitride film forming the sidewall spacer are formed at the high temperatures described above, a dopant implanted in a shallow dopant diffused region is diffused, which tends to cause the short channel effect. Also, the problem that boron is depleted from the gate electrode, etc., the so-called boron depletion, takes place, which leads to threshold voltage variations, etc. of the transistors.

By plasma CVD, silicon nitride film can be formed at a low temperature of 200–300° C., using $SiH_4$ (monosilane) and $NH_3$ as raw materials (refer to Non-Patent Reference 2). By plasma CVD, silicon oxide film can be formed also at the low temperature. However, when silicon nitride film, etc. forming the sidewall spacer are formed by plasma CVD, the semiconductor substrate is damaged, and the silicon nitride film, etc. contain hydrogen. When the silicon nitride film, etc. forming the sidewall spacer contains hydrogen, the threshold voltage variation of the transistors is caused. Accordingly, plasma CVD has not been usable in forming the silicon nitride film, etc. forming the sidewall spacer.

In some cases, a cap film or a stopper film is formed of SiN after inter-layer insulation film covering transistors have been formed. In such cases, the cap film or the stopper film must be formed at relatively low temperatures for the prevention of deformation, deterioration, etc. of the inter-layer insulation films. Accordingly, the cap film and the stopper film have been conventionally formed by plasma CVD, which can form films at low temperatures. The silicon nitride film forming the sidewall spacer has been formed by thermal CVD of high temperatures described above. The cap film and stopper film, and the sidewall spacer have not been formed by one and the same semiconductor fabrication system. This has been a barrier factor for decreasing the equipment investment.

SUMMARY OF THE INVENTION

An object of the present invention is to provide a semiconductor device fabrication method which can control the diffusion of a dopant in the shallow dopant diffused region, etc.

According to one aspect of the present invention, there is provided a method for fabricating a semiconductor device comprising the steps of forming a gate electrode on a semiconductor substrate with a gate insulation film formed therebetween; implanting a dopant into the semiconductor substrate with the gate electrode as a mask to form dopant diffused regions in the semiconductor substrate on both sides of the gate electrode; and forming a silicon oxide film covering the gate electrode; and anisotropically etching the silicon oxide film to form a sidewall spacer including the silicon oxide film on the side wall of the gate electrode, in the step of forming the silicon oxide film, the silicon oxide film being formed by thermal CVD at a 500–580° C. film forming temperature, using bis(tertiary-butylamino)silane and oxygen as raw materials.

According to another aspect of the present invention, there is provided a method for fabricating a semiconductor device comprising the steps of forming a gate electrode on a semiconductor substrate with a gate insulation film formed therebetween; implanting a dopant into the semiconductor substrate with the gate electrode as a mask to form a dopant diffused region in the semiconductor substrate on both sides of the gate electrode; and forming a silicon oxide film covering the gate electrode; and anisotropically etching the silicon oxide film to form a sidewall spacer including the silicon oxide film on the side wall of the gate electrode, in the step of forming the silicon oxide film, the silicon oxide film being formed by thermal CVD at a 560–580° C. film forming temperature, using tetra-ethyl-ortho-silicate and oxygen as raw materials.

According to further another aspect of the present invention, there is provided a method for fabricating a semiconductor device comprising the steps of forming a gate electrode on a semiconductor substrate with a gate insulation film formed therebetween; implanting a dopant into the semiconductor substrate with the gate electrode as a mask to form a dopant diffused region in the semiconductor substrate on both sides of the gate electrode; and forming a silicon oxide film covering the gate electrode; and anisotropically etching the silicon oxide film to form a sidewall spacer including the silicon oxide film on the side wall of the gate electrode, in the step of forming the silicon oxide film, the silicon oxide film being formed by thermal CVD at a 600–700° C. film forming temperature for a period of film forming time of below 15 minutes, using silane and nitrous oxide as raw materials.

According to further another aspect of the present invention, there is provided a method for fabricating a semiconductor device comprising the steps of forming a gate electrode on a semiconductor substrate with a gate insulation film formed therebetween; implanting a dopant into the semiconductor substrate with the gate electrode as a mask to form a dopant diffused region in the semiconductor substrate on both sides of the gate electrode; and forming a silicon oxide film covering the gate electrode; and anisotropically etching the silicon oxide film to form a sidewall spacer including the silicon oxide film on the side wall of the gate electrode, in the step of forming the silicon oxide film, the silicon oxide film beig formed by thermal CVD at a 480–500° C. film forming temperature for a period of film forming time of below 30 minutes, using TEOS and ozone as raw materials.

According to further another aspect of the present invention, there is provided a method for fabricating a semiconductor device comprising the steps of forming a gate electrode on a semiconductor substrate with a gate insulation film formed therebetween; implanting a dopant into the semiconductor substrate with the gate electrode as a mask to form a dopant diffused region in the semiconductor substrate on both sides of the gate electrode; and forming a silicon oxide film covering the gate electrode; and anisotropically etching the silicon oxide film to form a sidewall spacer including the silicon oxide film on the side wall of the gate electrode, in the step of forming the silicon oxide film, the silicon oxide film being formed by thermal CVD at a 500–530° C. film forming temperature for a period of film forming time of below 30 minutes, using disilane and nitrous oxide.

According to further another aspect of the present invention, there is provided a method for fabricating a semiconductor device comprising the step of forming an insulation film of SiN, SiCN or SiOCN, using a first raw material of a compound containing at least silicon and nitrogen, and a second raw material of a compound containing a plurality of nitrogen atoms in a molecule.

According to the present invention, silicon oxide film forming the sidewall spacers is formed by thermal CVD at a relatively low film forming temperature of 500–580° C., using BTBAS and $O_2$ as the raw materials. According to the present invention, silicon oxide film is formed by thermal CVD at a film forming temperature of 560–580° C., using TEOS and $O_2$ as the raw materials. Silicon oxide film is formed at a relatively low film forming temperature, whereby the diffusion of a dopant in the doapnt diffused regions forming the shallow region of the extension source/drain structure and the pocket regions can be suppressed.

According to the present invention, silicon oxide film forming the sidewall spacers is formed by thermal CVD at a film forming temperature of 600–700° C. for a period of film forming time of below 15 minutes, using silane and nitrous oxide as the raw materials. The relatively short period of film forming time suppresses the diffusion of a dopant in the shallow dopant diffused regions and the pocket regions.

According to the present invention, silicon oxide film forming the sidewall spacers is formed by thermal CVD at a 480–500° C. film forming temperature for a period of film forming time of below 30 minutes, using TEOS and $O_3$ as the raw materials. According to the present invention, silicon oxide film is formed by thermal CVD at a 500–530° C. film forming temperature for a period of film forming time of below 30 minutes, using disilane and $N_2O$ as the raw materials. The relatively low film forming temperature and the short period of film forming time make it possible to further suppress the diffusion of a dopant in the shallow dopant diffused regions and the pocket regions.

According to the present invention, silicon nitride film is formed by thermal CVD at a relatively low film forming temperature of 550–580° C., using BTBAS and $NH_3$ as the raw material. The silicon nitride film is formed at a relatively low temperature, whereby the diffusion of a dopant in the dopant diffused regions forming the shallow region of the extension source/drain structure and the pocket regions can be suppressed.

According to the present invention, silicon nitride film forming the sidewall spacers is formed by thermal CVD at a 650–700° C. film forming temperature for a period of film forming time of below 15 minutes, using silane and $NH_3$ as the raw materials. The relatively short period of film forming time can make it possible to suppress the diffusion of a dopant in the dopant diffused regions forming the shallow region of the extension source/drain and the pocket regions.

According to the present invention, silicon nitride film is formed, using a raw material of a compound containing silicon and nitrogen and a raw material of a compound containing a plurality of nitrogen atoms in a molecule, whereby the silicon nitride film can be formed at a relatively low film forming temperature. Accordingly, the diffusion of a dopant in the dopant diffused regions of the extension source and drain structure and the pocket regions can be suppressed. Thus, the short channel effect and the current drive decrease of the transistors can be prevented. The roll-off resistance can be improved. Accordingly, the present invention can fabricate micronized semiconductor devices of good electric characteristics.

According to the present invention, cap films and stopper films of SiN, SiCN or SiOCN can be formed by thermal CVD or plasma enhanced CVD at relatively low temperatures, which allows the cap films and the stopper films, and the sidewall spacers to be formed by one and the same semiconductor fabricating system. Thus, the present invention can decrease equipment investment and simplify the process.

DETAILED DESCRIPTION OF THE INVENTION

[A Fist Embodiment]

The semiconductor device fabrication method according to a first embodiment of the present invention will be explained with reference to FIGS. 1A to 12. FIGS. 1A to 8 are sectional views of a semiconductor device in the steps of the semiconductor device fabrication method according to the present embodiment, which show the method.

Figure 1A:
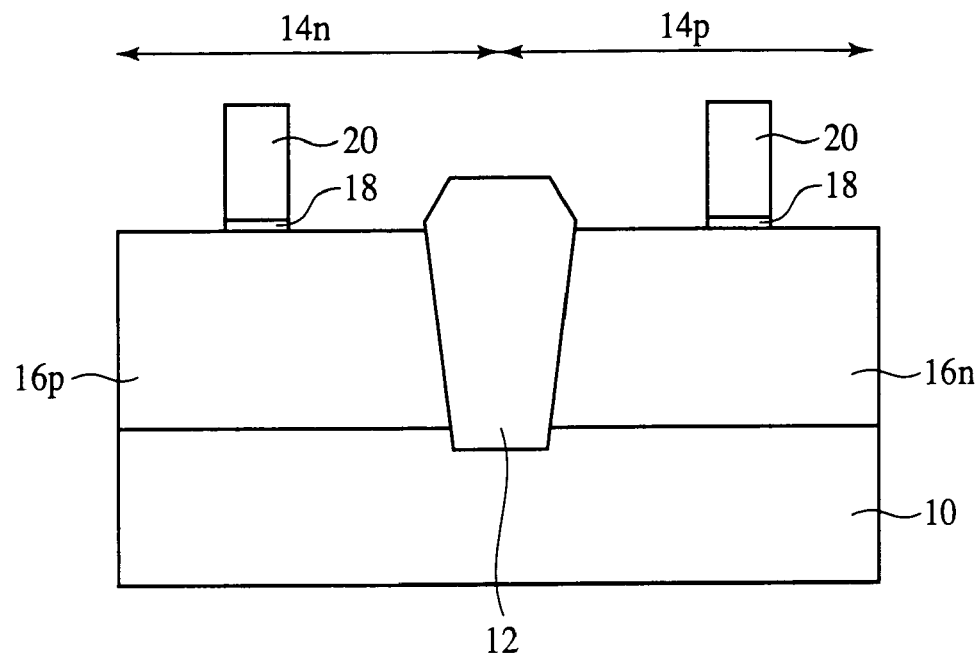
FIGS. 1A and 1B are sectional views of a semiconductor device in the steps of a semiconductor device fabrication method according to a first embodiment of the present invention, which show the method (Part 1).

First, as shown in FIG. 1A, an element isolation region 12 for defining element region is formed on a semiconductor substrate 10, e.g., silicon. The element isolation region 12 can be formed by, e.g., STI (Shallow Trench Isolation).

Then, a photoresist film (not shown) is formed on the entire surface by, e.g., spin coating.

Then, an opening (not shown) for opening a region 14n for an NMOS transistor to be formed in is formed in the photoresist film by photolithography.

Then, with the photo resist film as the mask, a p-type dopant is implanted to thereby a p-type well 16p in the semiconductor substrate 10 in the region 14n, where the NMOS transistor is to be formed.

Then, the photoresist film is released.

Next, a photoresist film (not shown) is formed on the entire surface by, e.g., spin coating.

Then, an opening (not shown) for opening a region 14p for a PMOS transistor to be formed in is opened in the photoresist film by photolithography.

Then, with the photoresist film as the mask, an n-type dopant is implanted to thereby an n-type well 16n in the semiconductor substrate 10 in the region 14p, where the PMOS transistor is to be formed.

Next, a 1.2 nm-thickness gate insulation film 18 is formed on the entire surface. The gate insulation film 18 can be formed by, e.g., thermal oxidation.

Then, a 100 nm-thickness polysilicon film is formed on the entire surface. Then, the polysilicon film is patterned in a configuration of the gate electrode by photolithography. Anisotropic etching, for example, is used in the patterning. Thus, a gate electrode 20 of polysilicon is formed.

Figure 1B:
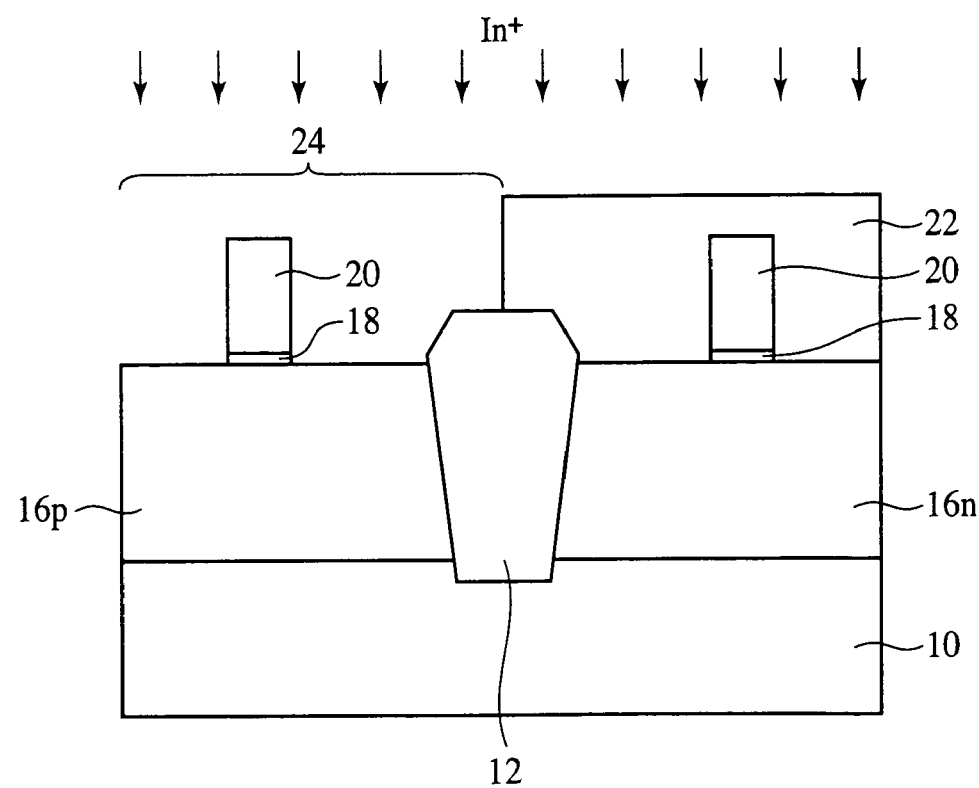

Next, as shown in FIG. 1B, a photoresist film 22 is formed on the entire surface by, e.g., spin coating.

Next, an opening 24 for opening the region 14n for the NMOS transistor to be formed in is opened in the photoresist film 22 by photolithography.

Next, a p-type dopant is implanted in the semiconductor substrate 10 on both sides of the gate electrode 20 by, e.g., ion implantation with the photoresist film 24 and the gate electrode 20 as the mask. The p-type dopant can be, e.g., indium (In). Conditions for the ion implantation are, e.g., a 50 keV acceleration energy a $5\times10^{13}$ cm$^{-2}$ dose. Thus, a p-type pocket region 26 is formed in the semiconductor substrate 10 on both sides of the gate electrode 20 (refer to FIG. 2A).

In the present embodiment, the p-type dopant is indium but is not essentially limited to indium. The p-dopant can be, e.g., boron (B). When boron is used as the p-type dopant, the acceleration energy is, e.g., 5 keV, and the dose is, e.g., $5\times10^{13}$ cm$^{-2}$.

Next, an n-type dopant is implanted in the semiconductor substrate 10 on both sides of the gate electrode 20 by, e.g., ion implantation with the photoresist film 22 and the gate electrode 20 as the mask. Then type dopant can be, e.g., arsenic (As). Conditions for the ion implantation are, e.g., a 5 keV acceleration energy a $1\times10^{15}$ cm$^{-2}$ dose.

Then, the photoresist film 22 is released.

Figure 2A:
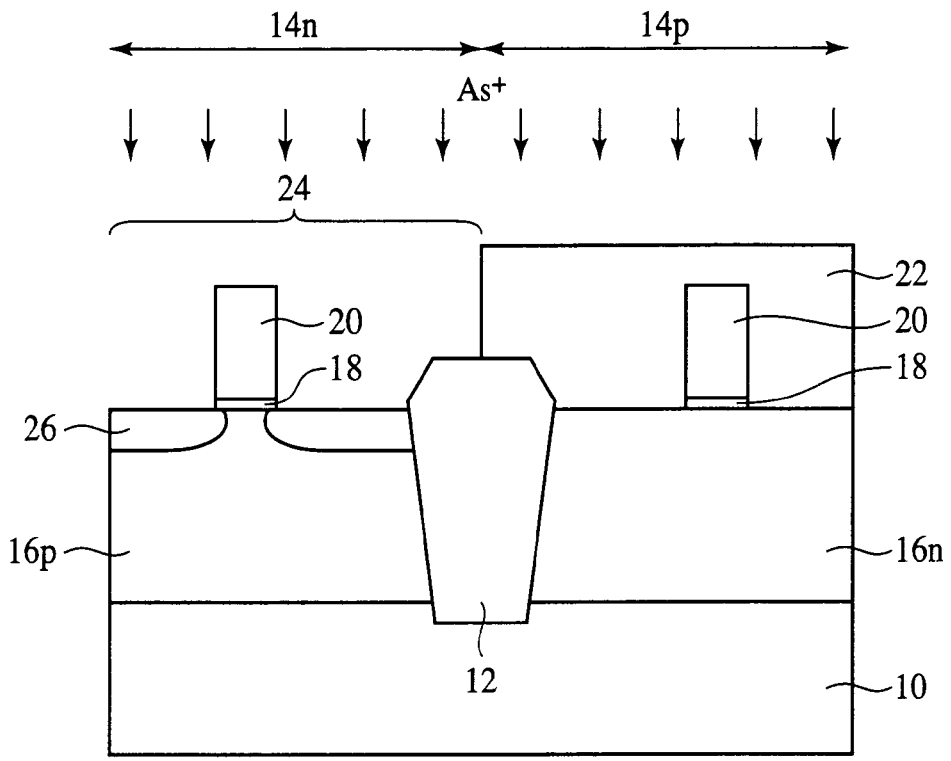
FIGS. 2A and 2B are sectional views of a semiconductor device in the steps of a semiconductor device fabrication method according to the first embodiment of the present invention, which show the method (Part 2).
Figure 2B:
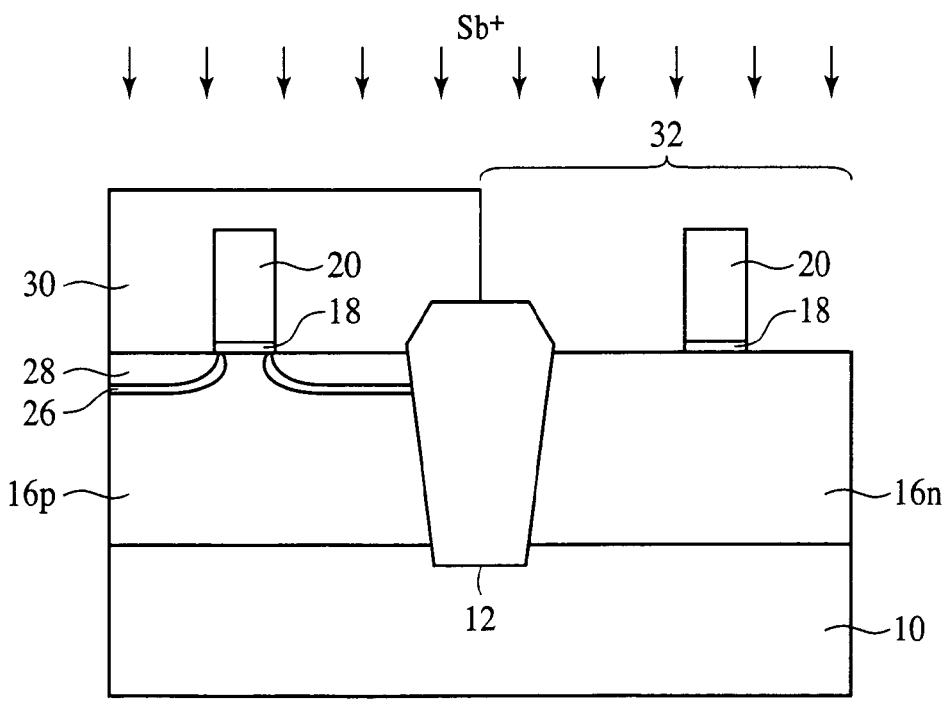

Thus, a dopant diffused region 28 forming a shallow region of the extension source/drain region, i.e., an extension region is formed in the semiconductor substrate 10 on both sides of the gate electrode 20 (refer to FIG. 2B).

Then, a photoresist film 30 is formed on the entire surface by, e.g., spin coating.

Next, an opening 32 for opening the region 14p for the PMOS transistor to be formed in the photoresist film 30 by photolithography.

Then, with the photoresist film 30 and the gate electrode 20 as the mask, an n-type dopant is implanted in the semiconductor substrate 10 on both side of the gate electrode 20. The n-type dopant can be, e.g., antimony (Sb). Conditions for the ion implantation are, e.g., a 60 keV acceleration energy a $5\times10^{13}$ cm$^{-2}$ dose. Thus, an n-type pocket region 34 is formed in the semiconductor substrate 10 on both sides of the gate electrode 20 (refer to FIG. 3A).

Next, a p-type dopant is implanted in the semiconductor substrate 10 on both sides of the gate electrode 20 by, e.g., ion implantation with the photoresist film 30 and the gate electrode 20 as the mask. The p-type dopant can be, e.g., boron. Conditions for the ion implantation are, e.g., a 1 keV acceleration energy a $1\times10^{15}$ cm$^{-2}$ dose.

Then, the photoresist film 30 is released off.

Figure 3A:
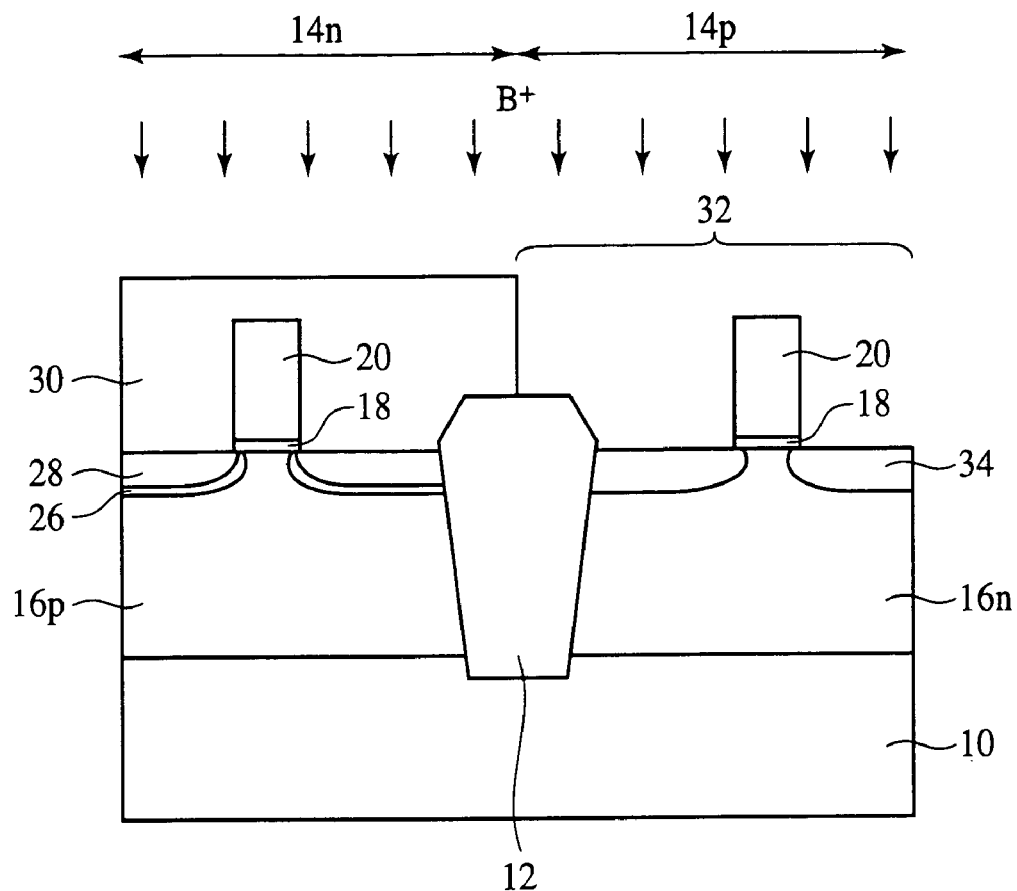
FIGS. 3A and 3B are sectional views of a semiconductor device in the steps of a semiconductor device fabrication method according to the first embodiment of the present invention, which show the method (Part 3).
Figure 3B:
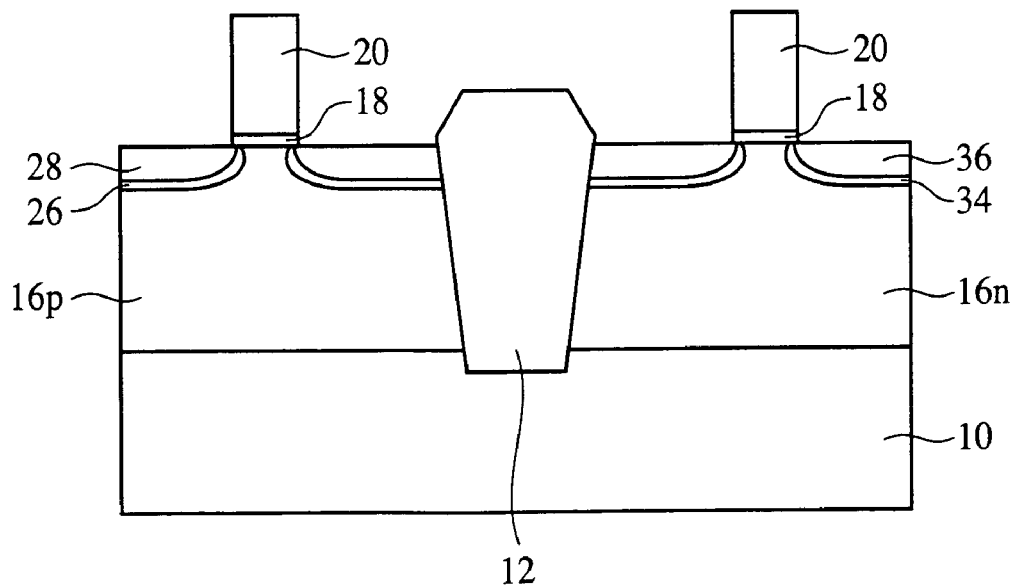

Thus, a dopant diffused region 36 forming the shallow region of the extension source/drain structure, i.e., an extension region is formed in the semiconductor substrate 10 on both sides of the gate electrode 20 (refer to FIG. 3B).

Figure 4A:
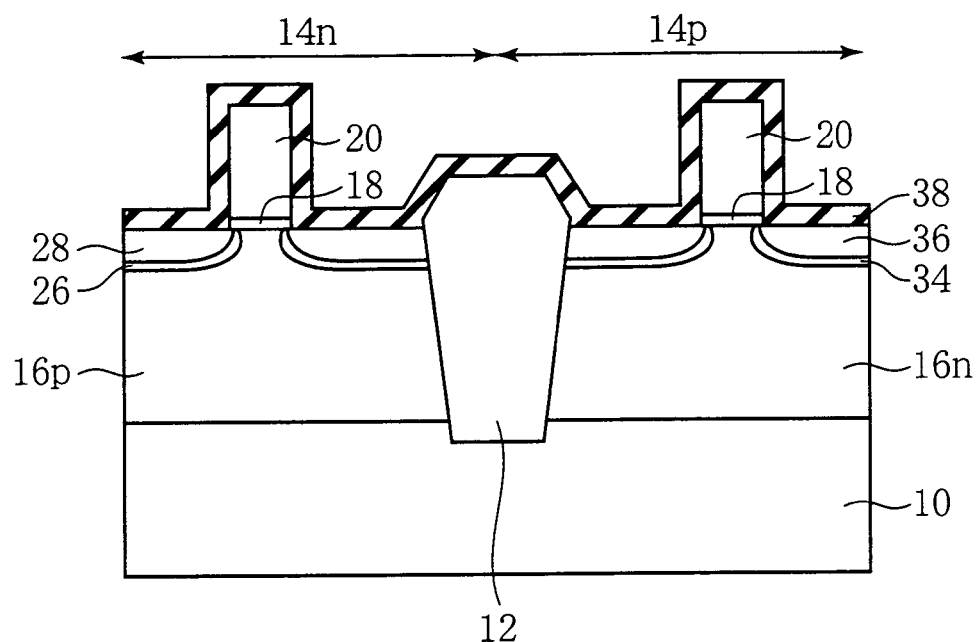
FIGS. 4A and 4B are sectional views of a semiconductor device in the steps of a semiconductor device fabrication method according to the first embodiment of the present invention, which show the method (Part 4).

Next, as shown in FIG. 4A, a 10–30 nm-thickness silicon oxide film 38 is formed on the entire surface by, e.g., low pressure thermal CVD. The raw material is BTBAS (Bis (Tertiary-ButylAmino)Silane) and $O_2$. The film forming temperature is, e.g., 500–580° C. The pressure in the film forming chamber is, e.g., 10–60 Pa. The flow rate of the BTBAS is, e.g., 20–60 sccm. The flow rate of the $O_2$ is, e.g., 80–240 sccm. The period of film forming time is, e.g., 5–20 minutes. When the film forming temperature is set lower, or the pressure in the film forming chamber is set lower, the period of film forming time is set longer.

In the present embodiment, the silicon oxide film 38 is formed by low pressure thermal CVD, but the forming method for the silicon oxide film 38 is not essentially limited to low pressure thermal CVD. Atmospheric pressure thermal CVD, for example, may be used. However, low pressure thermal CVD tends to form the silicon oxide film 38 of better step coverage than atmospheric pressure thermal CVD.

Figure 4B:
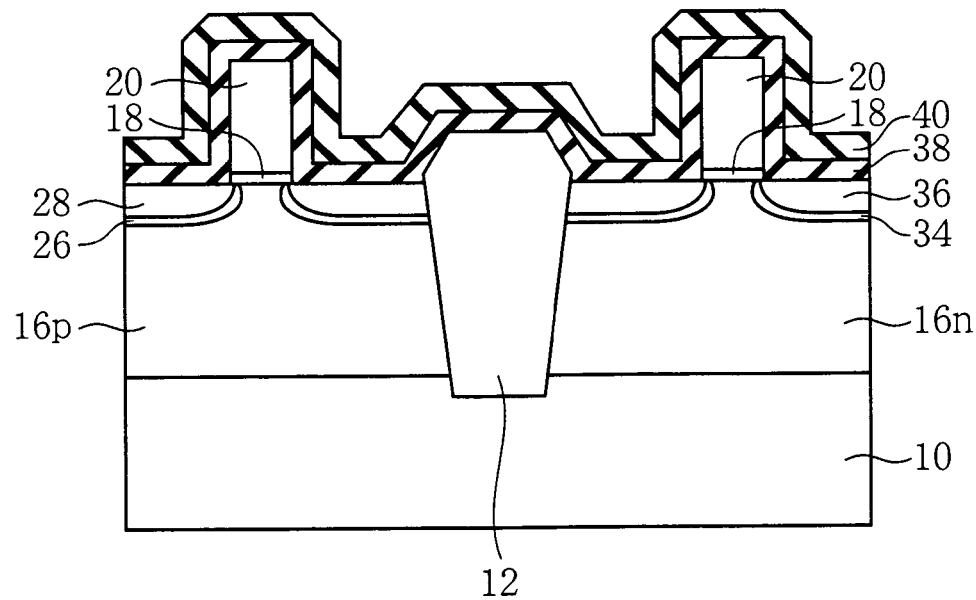

Then, as shown in FIG. 4B, a 40–80 nm-thickness silicon nitride film 40 is formed on the entire surface by, e.g., low pressure thermal CVD. The taw material is BTBAS and $NH_3$ (ammonium). The film forming temperature is, e.g., 550–580° C. The pressure in the film forming chamber is, e.g., 50–300 Pa. The flow rate of the BTBAS is 30–100 sccm. The flow rate of $NH_3$ is, e.g., 120–400 sccm. The period of film forming time is, e.g., 40–240 minutes. When the film forming temperature is set lower, or the pressure in the film forming chamber is set lower, the period of film forming time is set longer.

In the present embodiment, the silicon nitride film 40 is formed by low pressure thermal CVD, but the forming method for the silicon nitride film 40 is not essentially limited to low pressure thermal CVD. Atmospheric pressure thermal CVD, for example, may be used. However, low pressure thermal CVD tends to form the silicon nitride film 40 of better step coverage than atmospheric pressure thermal CVD.

Figure 5A:
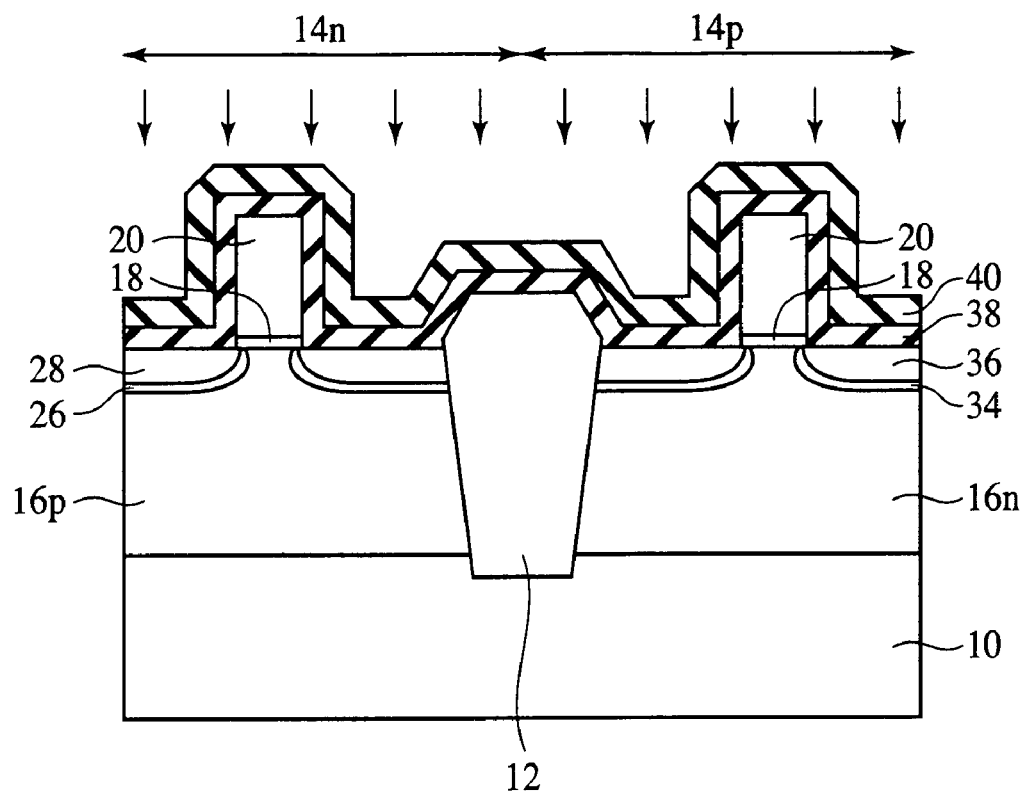
FIGS. 5A and 5B are sectional views of a semiconductor device in the steps of a semiconductor device fabrication method according to the first embodiment of the present invention, which show the method (Part 5).
Figure 5B:
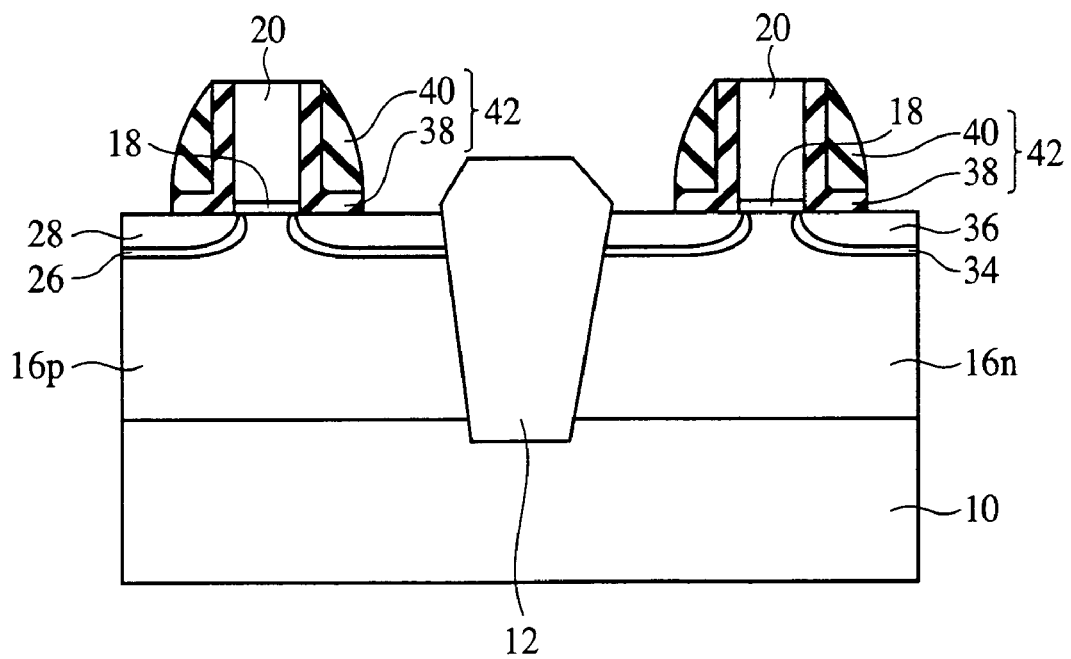

Next, as shown in FIG. 5A, the silicon nitride film 40 and the silicon oxide film 38 are anisotropically etched. The etching gas is, e.g., hydrofluoro carbon. Thus, as shown in FIG. 5B, a sidewall spacer 42 of the layer structure of the silicon oxide film 38 and the silicon nitride film 40 is formed on the side walls of the gate electrodes 20.

Then, a photoresist film 44 is formed on the entire surface by, e.g., spin coating.

Figure 6A:
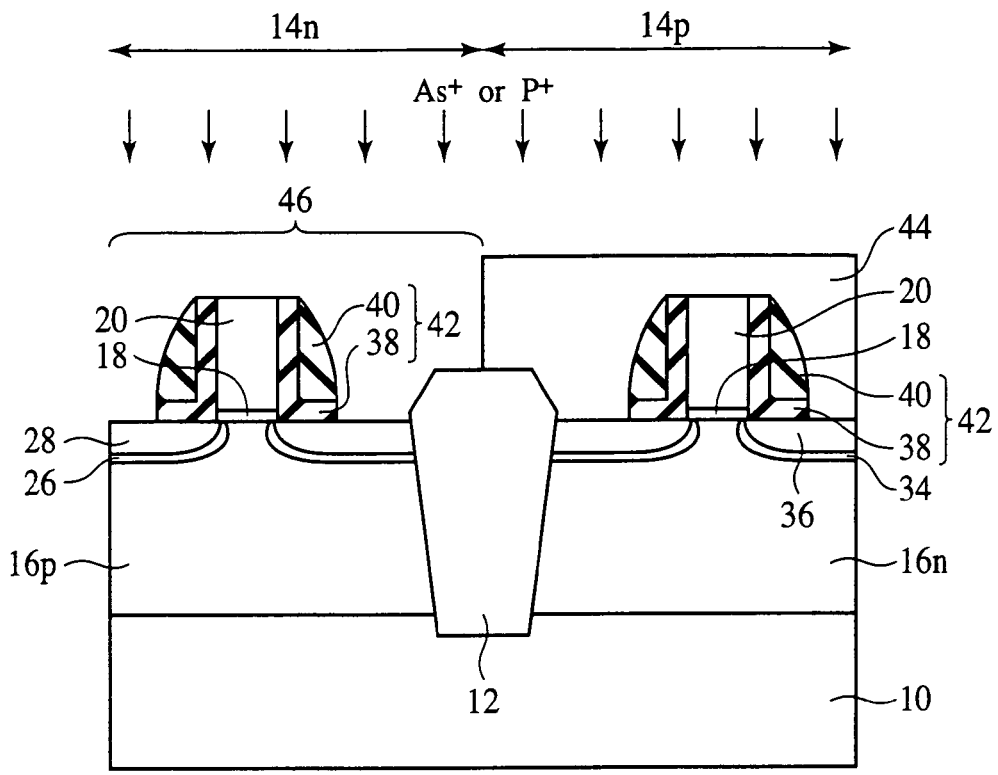
FIGS. 6A and 6B are sectional views of a semiconductor device in the steps of a semiconductor device fabrication method according to the first embodiment of the present invention, which show the method (Part 6).

Next, an opening 46 for opening a region 14n for the NMOS transistor to be formed in is formed in the photoresist film 44 by photolithography (refer FIG. 6A).

Figure 6B:
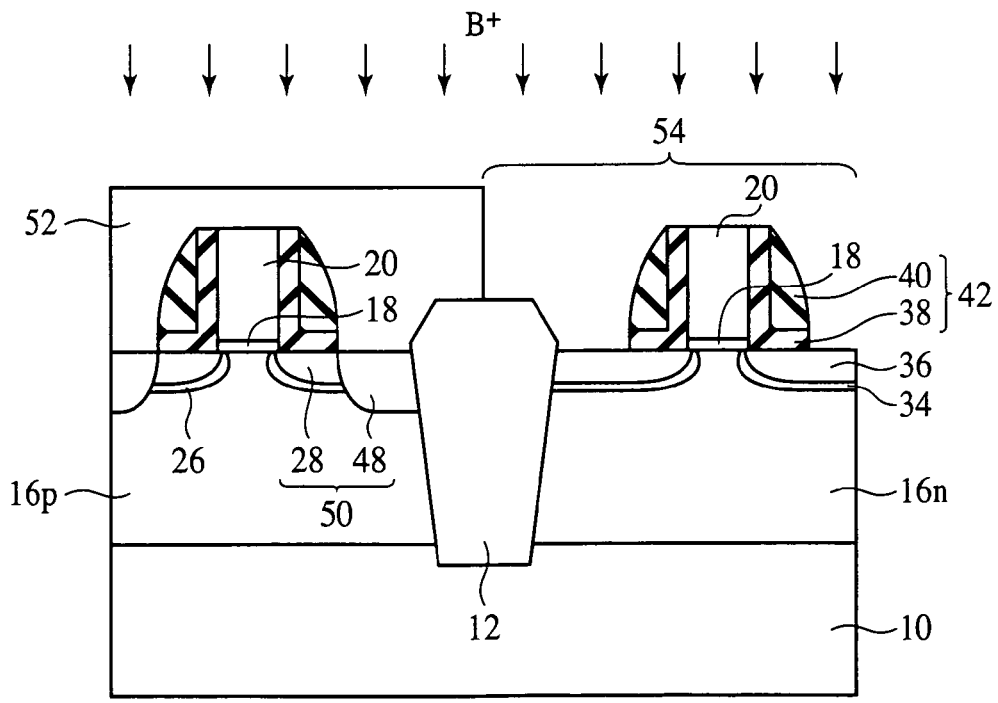

Then, as shown in FIG. 6B, with the photoresist film 44, the gate electrode 20 and the sidewall spacer 42 as the mask, an n-type dopant is implanted in the semiconductor substrate 10 by ion implantation. The n-type dopnat can be, e.g., arsenic or phosphorus (P). Ion implantation conditions are, e.g., a 6 keV acceleration energy and a $1 \times 10^{16}$ $cm^{-2}$ dose.

Thus, an n-type dopant diffused region 48 forming the deep region of the extension source/drain structure is formed in the semiconductor substrate 10 on both sides for the gate electrode 20 with the sidewall spacer 42 formed on the side wall (Refer to FIG. 6B). The deep dopant diffused region 48 is formed, having a higher carrier concentration than the shalllow dopant diffused region 28. The shallow dopant diffused region 28 and the deep dopant diffused region 48 form a source/drain diffused layer 50 of the extension source/drain structure.

Then, the photoresist film 44 is released off.

Next, a photoresist film 52 is formed on the entire surface by, e.g., spin coating.

Next, an opening 54 for opening a region 14p for the PMOS transistor to be formed in is formed in the photoresist film 52 by photolithography.

Next, with the photoresist film 52, the gate electrode 20 and the sidewall spacer 42 as the mask, a p-type dopant is implanted in the semiconductor substrate 10 by, e.g., ion implantation. The p-type dopant can be, e.g., boron (B) Conditions for the ion implantation are, e.g., a 8 keV acceleration energy and a $5 \times 10^{15}$ $cm^{-2}$ dose.

Figure 7A:
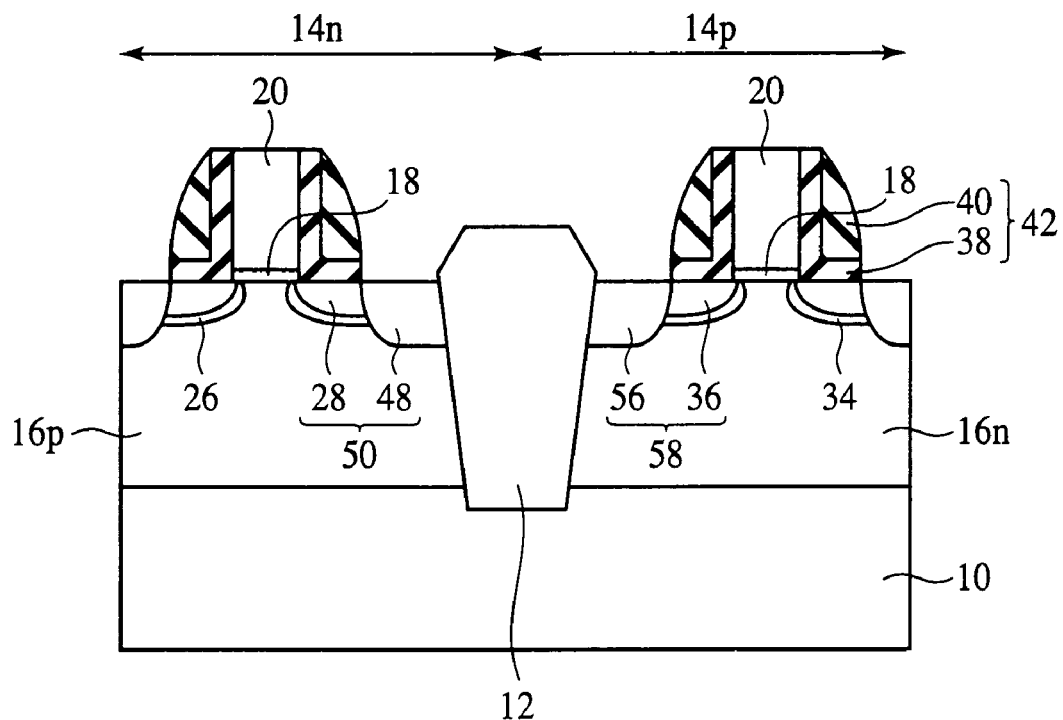
FIGS. 7A and 7B are sectional views of a semiconductor device in the steps of a semiconductor device fabrication method according to the first embodiment of the present invention, which show the method (Part 7).

Thus, a p-type dopant diffused region 56 forming an deep region of an extension source/drain structure is formed in the semiconductor substrate 10 on both sides of the gate electrode 20 with the sidewall spacer 42 formed on the side wall (refer to FIG. 7A). The deep dopant diffused region 56 is formed, having a higher carrier concentration than the shallow dopant diffused region 36. The shallow dopant diffused region 36 and the deep dopant diffused region 56 form a source/drain diffused layer 58 of the extension source/drain structure.

Then, the photoresist film 52 is released off.

Next, the thermal processing is performed for activating the dopant implanted in the source/drain diffused layers 50, 58 by, e.g., RTA (Rapid Thermal Annealing). The thermal processing is rapid annealing of, e.g., 1000° C. or higher.

Figure 7B:
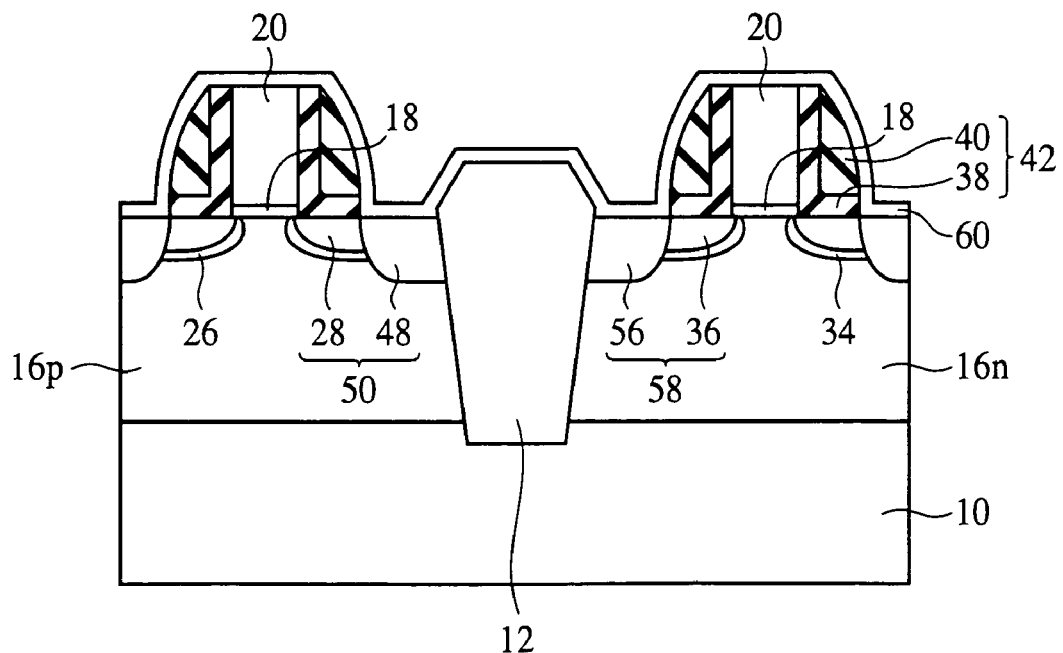
Figure 8:
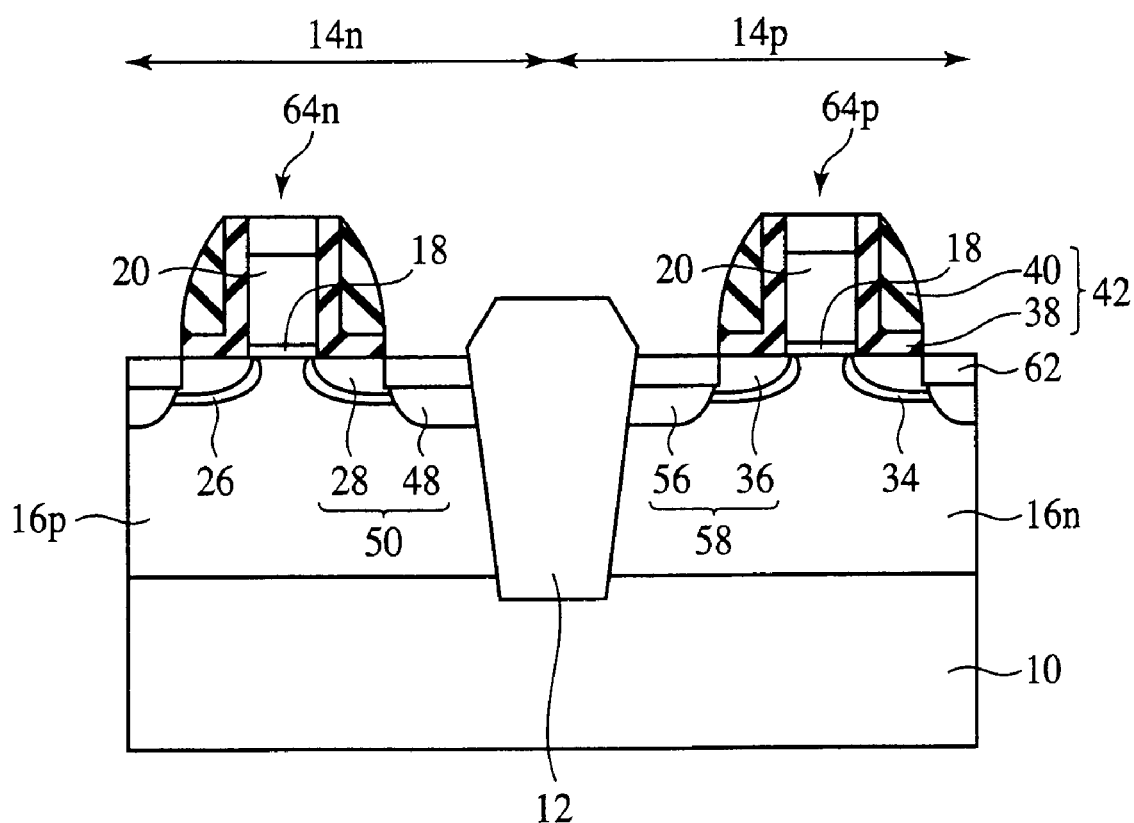
FIG. 8 is a sectional view of a semiconductor device in the steps of a semiconductor device fabrication method according to the first embodiment of the present invention, which shows the method (Part 8).

Next, as shown in FIG. 7B, a metal film 60 of, e.g., cobalt (Co) is formed on the entire surface by, e.g., sputtering. The metal film 60 has a thickness of, e.g., 5 nm or more.

Next, the thermal processing reacts the cobalt (Co) of the metal film 60 with the silicon (Si) of the semiconductor substrate 10. Thus, cobalt silicide film is formed. Then, the metal film 60 which has not reacted with the Si is removed. Thus, a source/drain electrode 62 of cobalt silicide is formed (refer to FIG. 8).

Thus, the semiconductor device including the NMOS transistor 64n and the PMOS transistor 64p is fabricated by the semiconductor device fabrication method according to the present embodiment.

The semiconductor device fabrication method according to the present embodiment is characterized mainly in that the silicon oxide film 38 is formed of BTBAS and $O_2$ as the raw material by thermal CVD at a film forming temperature of 500–580° C., and the silicon nitride film 40 is formed of BTBAS and $NH_3$ as the raw material by thermal CVD at a film forming temperature of 550–580° C.

Conventionally, the silicon oxide film and silicon nitride film forming the sidewall spacers 42 have been formed at high temperatures, whereby the dopant has been diffused in the dopant diffused regions 28, 36 forming the shallow regions of the extension source/drain structure, and accordingly transistors of good electrical characteristics have not been always formed. In the pocket regions 26. 34 as well, the dopant has been diffused, which has tended to lower the current driving ability of the transistors. On the other hand, plasma CVD can form silicon oxide film and silicon nitride film at relatively low temperatures. However, plasma CVD damages the semiconductor substrate 10, and the silicon oxide film and the silicon nitride film contain hydrogen. Accordingly, the use of plasma CVD causes variations of the threshold voltage of the transistors. Thus, when the silicon oxide film and the silicon nitride film are formed by plasma CVD, it is difficult to form transistors of the extension source/drain structure having good electric characteristics.

In contrast to this, in the present embodiment, the silicon oxide film is formed by thermal CVD, using BTBAS and $O_2$ as the raw materials at a relatively low film forming temperature of 500–580° C., and the silicon nitride film is formed by thermal CVD, using BTBAS and $NH_3$ as the raw materials at a relatively low film forming temperature of 550–580° C. Accordingly, in the present embodiment, the diffusion of the dopants in the dopant diffused regions 28, 36 forming the shallow regions of the extension source/drain structure and the pocket regions 26, 34 can be suppressed. Especially, the conspicuous effect of suppressing the dopant diffusion can be obtained when boron is used as the dopant implanted in the pocket region 26 of the NMOS transistor 64n, and boron is used as the dopant implanted in the shallow dopant diffused region 36 of the PMOS transistor 64p. Thus, according to the present embodiment, transistors of the extension source/drain structure and the pocket structure, which have very good electric characteristic can be fabricated. Therefore, the semiconductor device having very good electric characteristic can be provided.

(Evaluation Result)

Next, the evaluation result of the semiconductor device fabrication method according to the present embodiment will be explained with reference to FIGS. 9 to 12.

Figure 9:
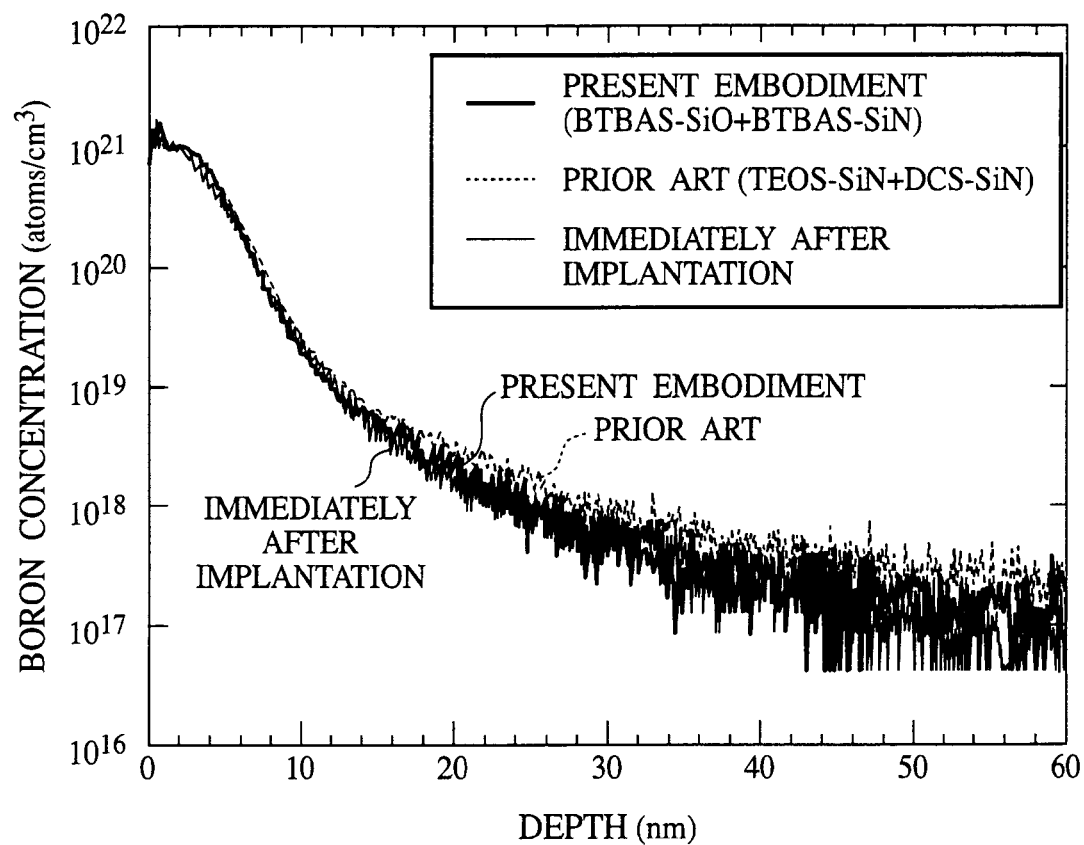
FIG. 9 is a graph of boron concentration distributions of a PMOS transistor.

The concentration distribution of boron in the PMOS transistor 64p will be explained with reference to FIG. 9. FIG. 9 is a graph of the concentration distribution of boron in the PMOS transistor. The boron concentration distribution was measured by SIMS (Secondary Ion Mass Spectrometry).

In FIG. 9, the thick solid line indicates the boron concentration distributions of the present embodiment after the silicon oxide film 38 was formed by thermal CVD, using BTBAS and $O_2$ as the raw materials at a film forming temperature of 530° C., and the silicon nitride film 40 was formed by thermal CVD, using BTBAS and $NH_3$ at a film forming temperature of 580° C.

In FIG. 9, the dot line indicates the boron concentration distributions of the conventional semiconductor device fabrication method after the silicon oxide film was formed by thermal CVD, using TEOS and $O_2$ as the raw materials at a film forming temperature of 620° C., and the silicon nitride film was formed by thermal CVD, using dichlorosilane and $NH_3$ as the raw materials, at a film forming temperature of 700° C.

In FIG. 9, the thin solid line indicates the boron concentration distributions immediately after boron was implanted in the semiconductor substrate 10 with the gate electrode 20 as the mask.

As seen in FIG. 9, in the conventional semiconductor device, when the boron concentration distributions immediately after the boron has been implanted and the boron concentration distributions after the film has been formed are compared, the boron concentration distributions are a little different.

In contrast to this, in the present embodiment, the boron concentration distributions immediately after the boron has been implanted, and the boron concentration distributions after the film has been formed, both boron concentration distributions are not substantially different.

Based on this, it can be seen that the present embodiment can suppress the diffusion of the boron when the silicon oxide film 38 and the silicon nitride film 40 are formed.

Figure 10:
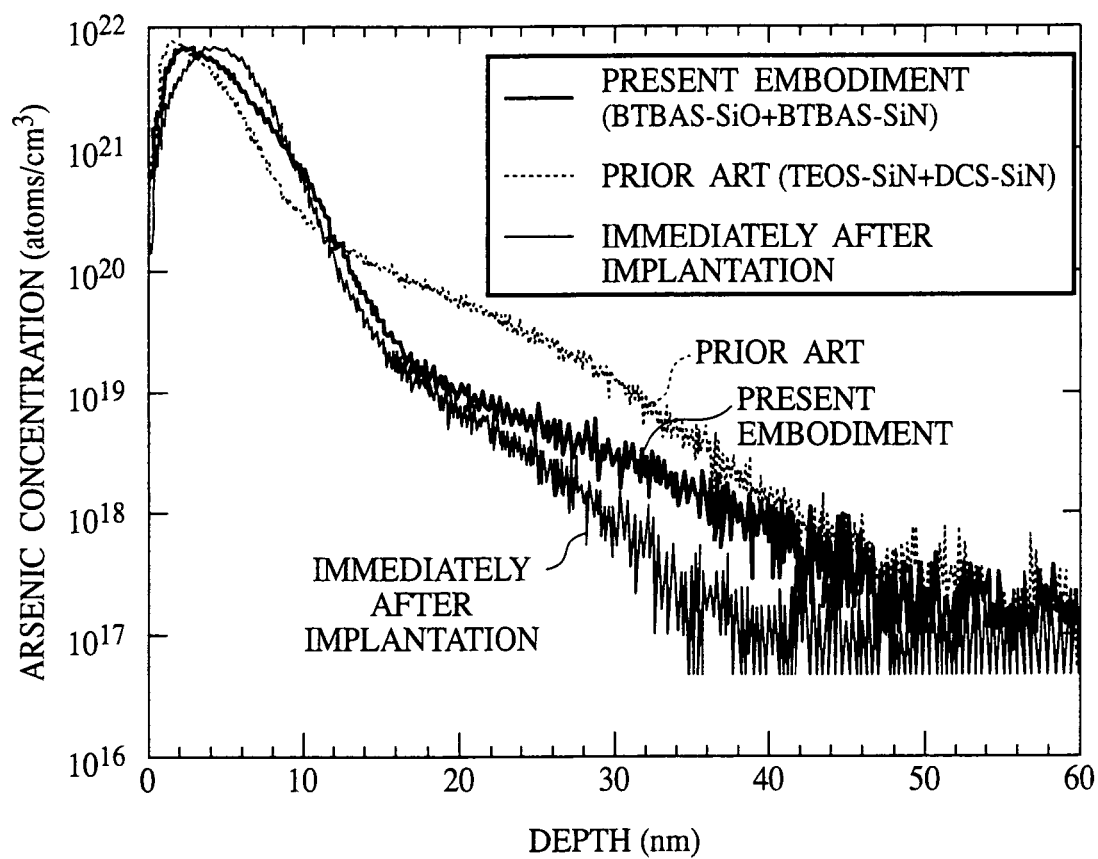
FIG. 10 is a graph of arsenic concentration distributions of an NMOS transistor.

Then, the concentration distributions of arsenic (As) in the NMOS transistor 64n will be explained with reference to FIG. 10. FIG. 10 is a graph of arsenic concentration distributions of the NMOS transistor. The arsenic concentration distributions were measured by SIMS.

In FIG. 10, the thick solid line indicates the arsenic concentration distributions of the present embodiment after the silicon oxide film 38 was formed by thermal CVD, using BTBAS and $O_2$ as the raw materials at a film forming temperature of 530° C., and the silicon nitride film 40 was formed by thermal CVD, using BTBAS and $NH_3$ as the raw materials at a film forming temperature of 580° C.

In FIG. 10, the dot line indicates the arsenic concentration distributions of the conventional semiconductor device fabrication method, in which the silicon oxide film was formed by thermal CVD, using TEOS and $O_2$ as the raw materials at a film forming temperature of 620° C., and the silicon nitride film was formed by thermal CVD, using dichlorosilane and $NH_3$ as the raw materials at a film forming temperature of 700° C.

In FIG. 10, the thin solid line indicated arsenic concentration distributions immediately after arsenic has been implanted in the semiconductor substrate 10 with the gate electrodes 20 as the mask.

As seen in FIG. 10, in the conventional semiconductor device, the arsenic concentration distributions immediately after arsenic has been implanted, and the arsenic distributions after the film has been formed are largely different from each other.

In contrast to this, when the arsenic concentration distributions immediately after the arsenic has been implanted, and the arsenic concentration distributions after the film has been formed are compared with each other, the arsenic concentration distributions have made no substantial change.

Based on this, it can be seen that the present embodiment can suppress the diffusion of the arsenic when the silicon oxide film 38 and the silicon nitride film 40 are formed.

Figure 11:
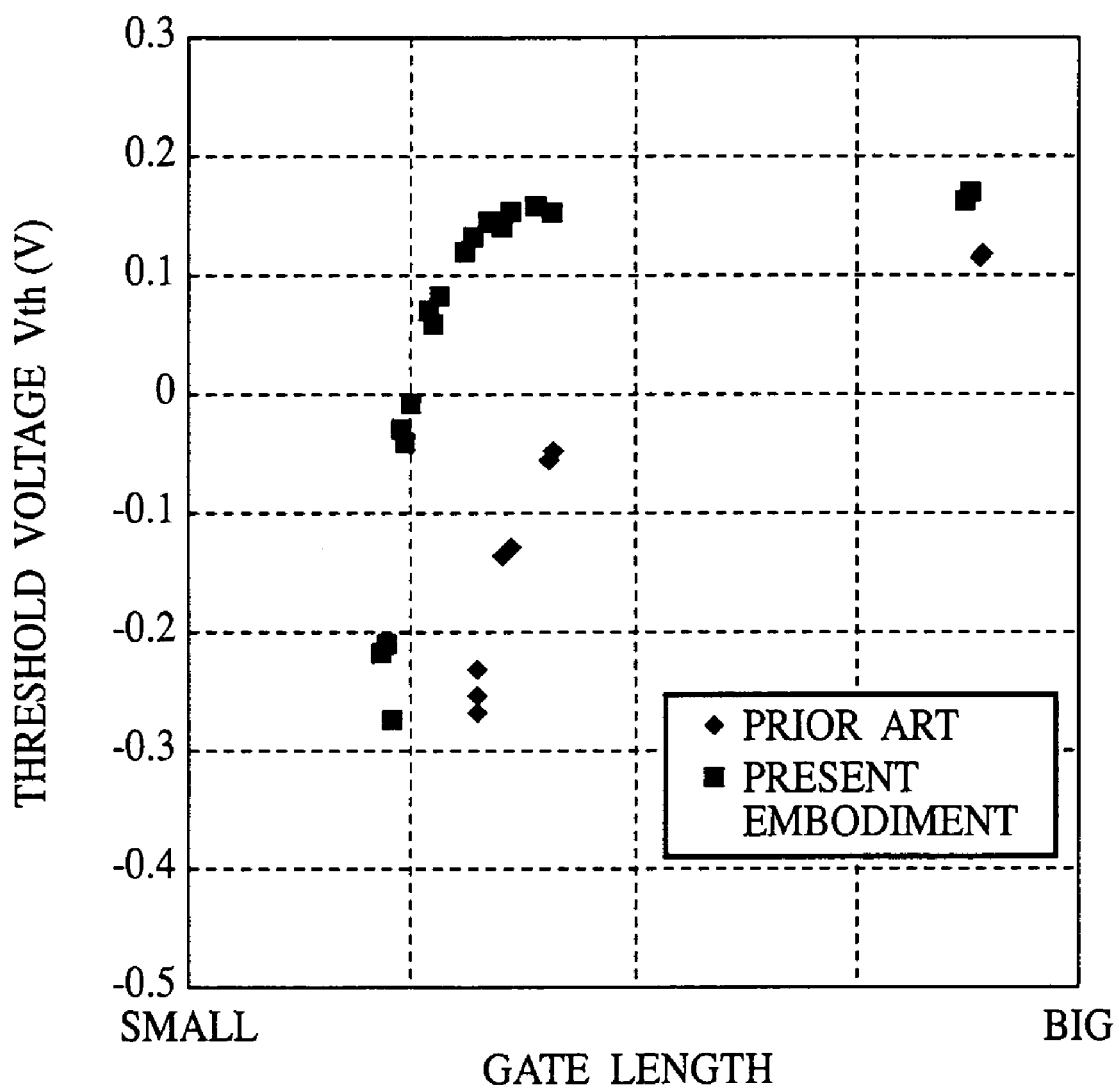
FIG. 11 is a graph of relationships between the gate length and the threshold voltage of the NMOS transistor.

Then, the roll-off characteristics of the NMOS transistor 64n will be explained with reference to FIG. 11. FIG. 11 is a graph of the gate lengths and the threshold voltages of the NMOS transistor. In FIG. 11, the gate lengths are taken on the horizontal axis. The gate length is shorter on the lefter side of the drawing and is longer on the righter side of the drawing. In FIG. 11, the threshold voltages $T_{th}$ are taken on the vertical axis.

In FIG. 11, the "■" marks indicate the gate length and the threshold voltage of the semiconductor device according to the present embodiment.

In FIG. 11, the "♦" marks indicate the gate lengths and the threshold voltages of the conventional semiconductor device.

As seen in FIG. 11, in the conventional semiconductor device, as the gate length is shorter, the threshold voltage $V_{th}$ more changes.

In contrast to this, in the semiconductor device according to the present embodiment, the change of the threshold voltage $V_{th}$ accompanying the decrease of the gate length is suppressed.

Based on this, it can be seen that the present embodiment can improve the roll-off characteristics of the NMOS transistor 64n.

Figure 12:
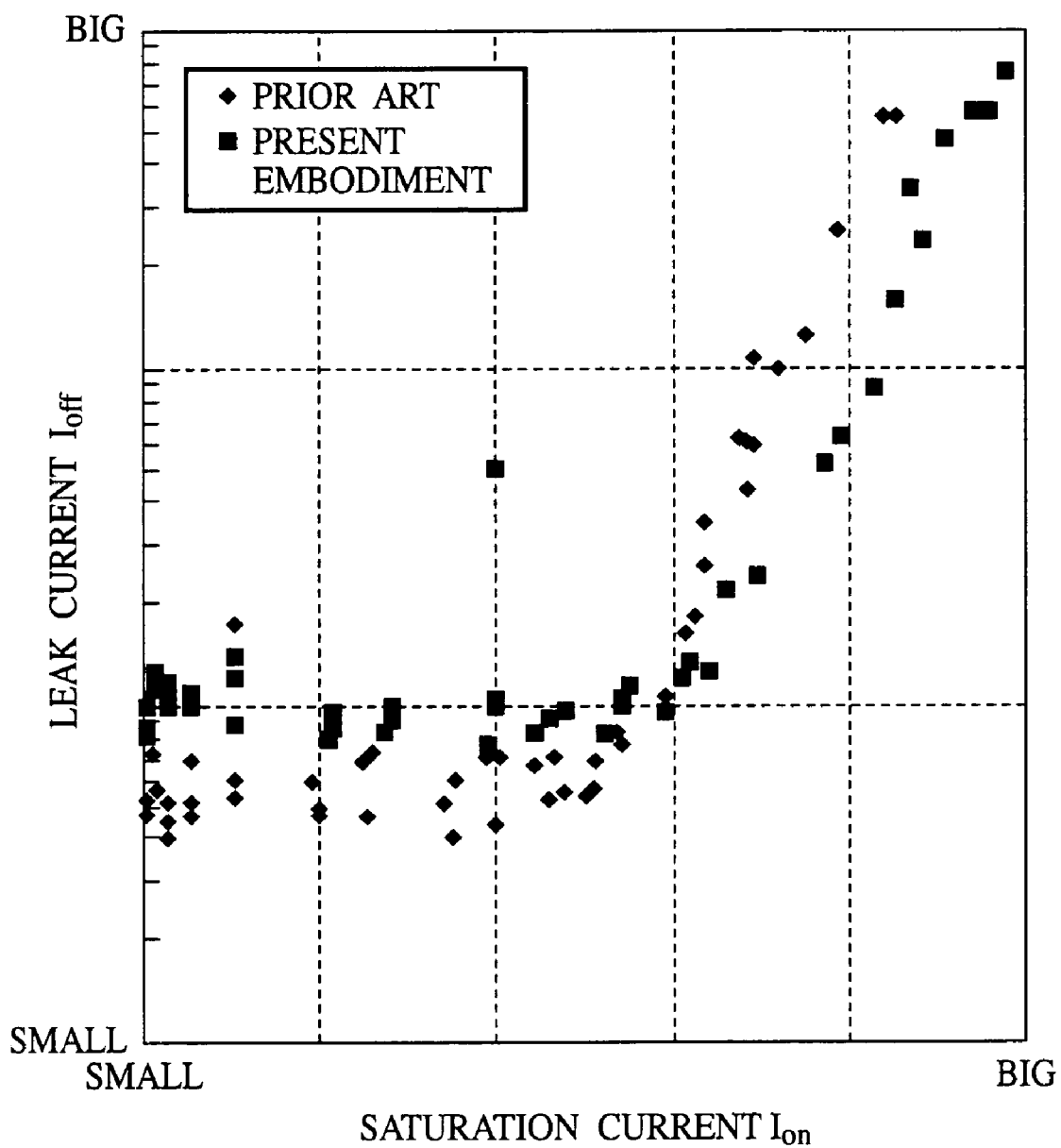
FIG. 12 is a graph of $I_{on}$-$I_{off}$ characteristics of the PMOS transistor.

Next, the $I_{on}$-$I_{off}$ characteristics of the PMOS transistor 64p will be explained with reference to FIG. 12. FIG. 12 is a graph of $I_{on}$-$I_{off}$ characteristics of the PMOS transistor. In FIG. 12, saturation currents $I_{on}$ are taken on the horizontal axis. The saturation current $I_{on}$ is smaller on the lefter side of the drawing and larger on the righter side of the drawing. In FIG. 12, leak currents $I_{off}$ are taken on the vertical axis. The leak current is larger on the upper side of the drawing and smaller on the lower side of the drawing.

In FIG. 12, the "■" marks indicate the $I_{on}$-$I_{off}$ characteristics of the semiconductor device according to the present embodiment.

In FIG. 12, the "♦" marks indicate the $I_{on}$-$I_{off}$ characteristics of the conventional semiconductor device.

As seen in FIG. 12, in the semiconductor device according to the present embodiment, the values of the saturation current $I_{on}$ for the values of the leak current $I_{off}$ are larger in comparison with those of the conventional semiconductor device.

Based on this, it can be seen that the present embodiment can improve the $I_{on}$-$I_{off}$ characteristics of the PMOS transistor 64p.

(Modifications)

Figure 13A:
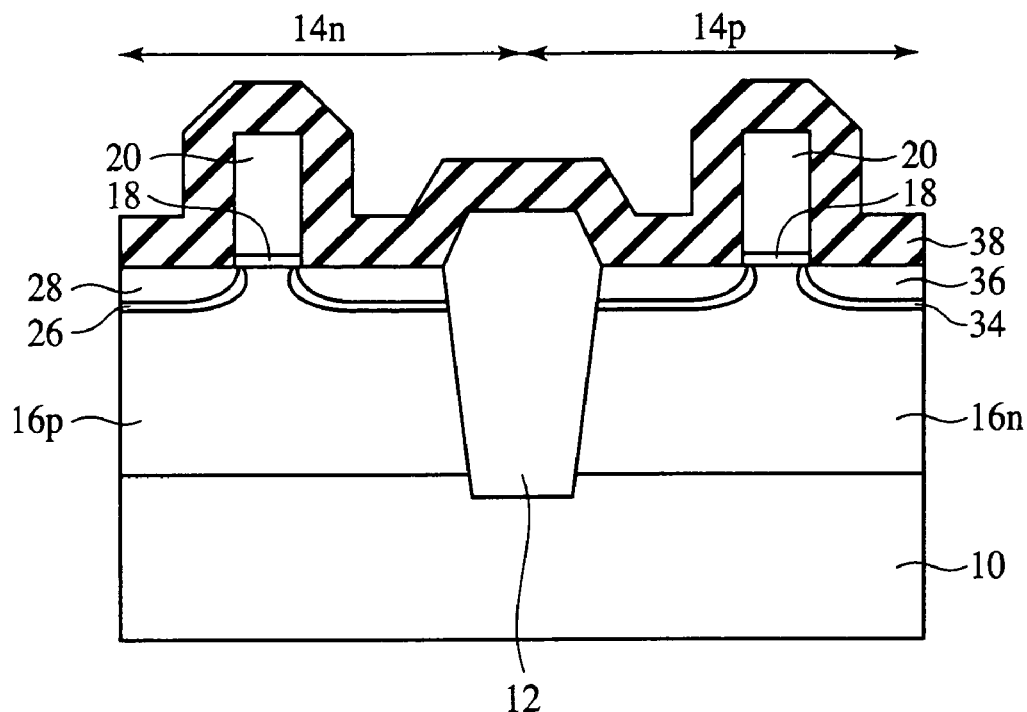
FIGS. 13A and 13B are sectional views of a semiconductor device in the steps of the semiconductor device fabrication method according to one modification of the first embodiment of the present invention, which show the method.
Figure 13B:
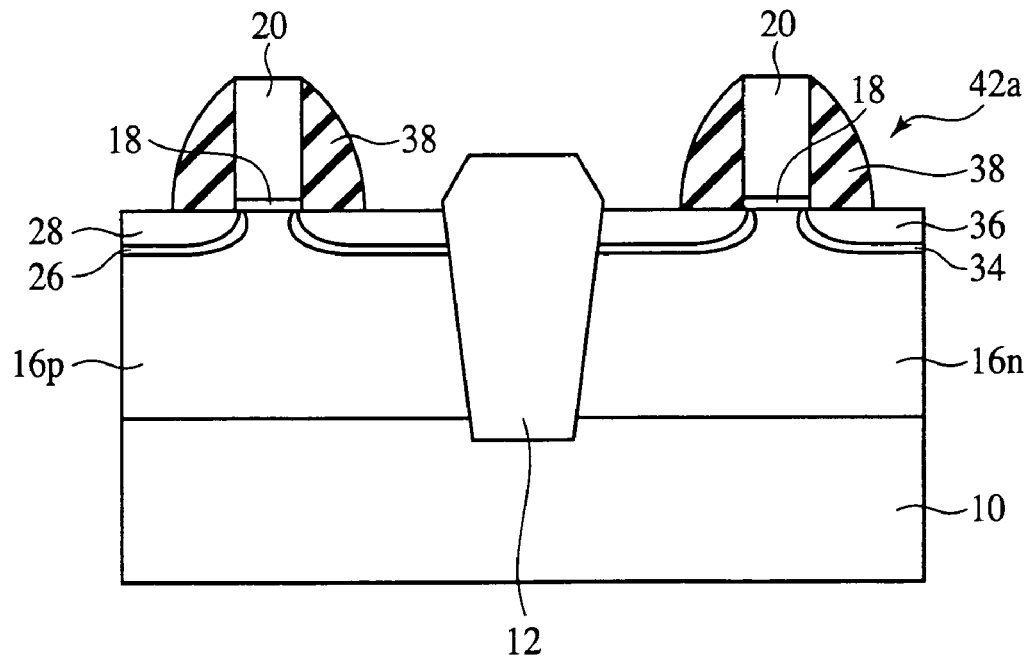

Next, a modification of the semiconductor device fabrication method according to the present embodiment will be explained with reference to FIGS. 13A and 13B. FIGS. 13A and 13B are sectional views of the semiconductor device according to the present modification in the steps of the semiconductor device fabrication method according to the present modification, which show the method.

The semiconductor device fabrication method according to the present modification is characterized mainly in that sidewall spacers 42a are formed of a silicon oxide film 38 alone.

The steps of the semiconductor device fabrication method according to the present modification up to the step of forming the dopant diffused region 36 forming the shallow region of the extension source/drain structure in the semiconductor substrate 10 on both sides of the gate electrode 20 including the dopant diffused region 36 forming step are the same as those of the semiconductor device fabrication method described above with reference to FIGS. 1A to 3B, and their explanation will not be repeated.

Next, as shown in FIG. 13A, a silicon oxide film 38 is formed on the entire surface by, e.g., thermal CVD. In the present modification, the sidewall spacer 42 is formed of the silicon oxide film 38 alone, and the silicon oxide film 38 is formed thicker. The film thickness of the silicon oxide film 38 is, e.g., about 100 nm. The raw materials are BTBAS and $O_2$. The film forming temperature is, e.g., 500–580° C., as described above. The pressure in the film forming chamber is, e.g., 10–60 Pa, as described above. The flow rate of the BTBAS is, e.g., 20–60 sccm, as described above. The flow rate of the $O_2$ is, e.g., 80–240 sccm, as described above.

Then, the silicon oxide film 38 is anisotropically etched. The etching gas is, e.g., hydrofluoro-carbon. Thus, as shown in FIG. 13B, the sidewall spacer 42a of the silicon oxide film 38 alone is formed on the side wall of the gate electrode 20. That is, the sidewall spacer 42 of the single layer structure is formed.

Then, the steps of the semiconductor device fabrication method according to the present modification are the same as those of the semiconductor device fabrication method described above with reference to FIGS. 6A to 8, and their explanation will not be repeated.

Thus, the semiconductor device is fabricated by the semiconductor device fabrication method according to the present modification.

As described above, the sidewall spacers 42a may be formed of the silicon oxide film 38 alone.

[A Second Embodiment]

The semiconductor device fabrication method according to a second embodiment of the present invention will be explained with reference to FIGS. 14A to 21B. FIGS. 14A to 21B are sectional views of a semiconductor device in the steps of the semiconductor device fabrication method according to the present embodiment, which show the method. The same members of the present embodiment as those of the semiconductor device fabrication method are represented by the same reference numbers not to repeat or to simplify their explanation.

The semiconductor device fabrication method according to the present embodiment is characterized mainly in that dopant diffused regions 48, 56 forming the deep regions of the extension source drain structure are formed before dopant diffused regions 28, 36 forming the shallow regions of the extension source/drain structure are formed.

Figure 14A:
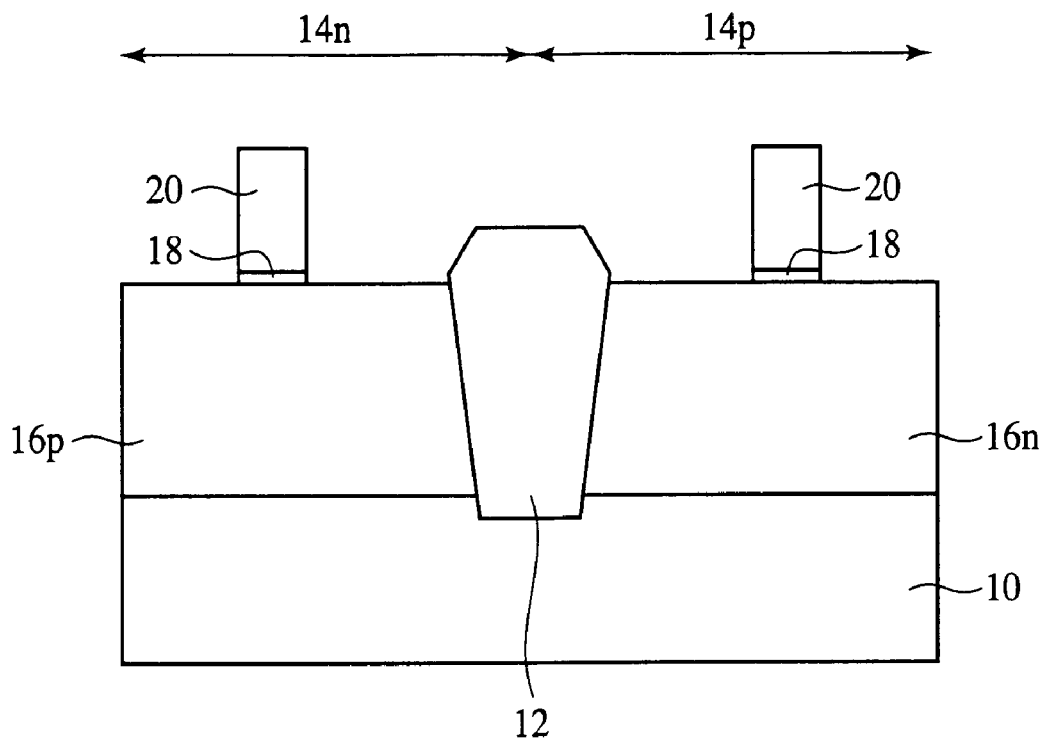
FIGS. 14A and 14B are sectional views of a semiconductor device in the steps of the semiconductor device fabrication method according to a second embodiment of the present invention, which show the method (Part 1).

The steps of the semiconductor device fabrication method according to the present embodiment up to the step of forming the gate electrode 20 including the gate electrode 20 forming step are the same as those of the semiconductor device fabrication method described above with reference to FIG. 1A, and their explanation will not be repeated (refer to FIG. 14A).

Figure 14B:
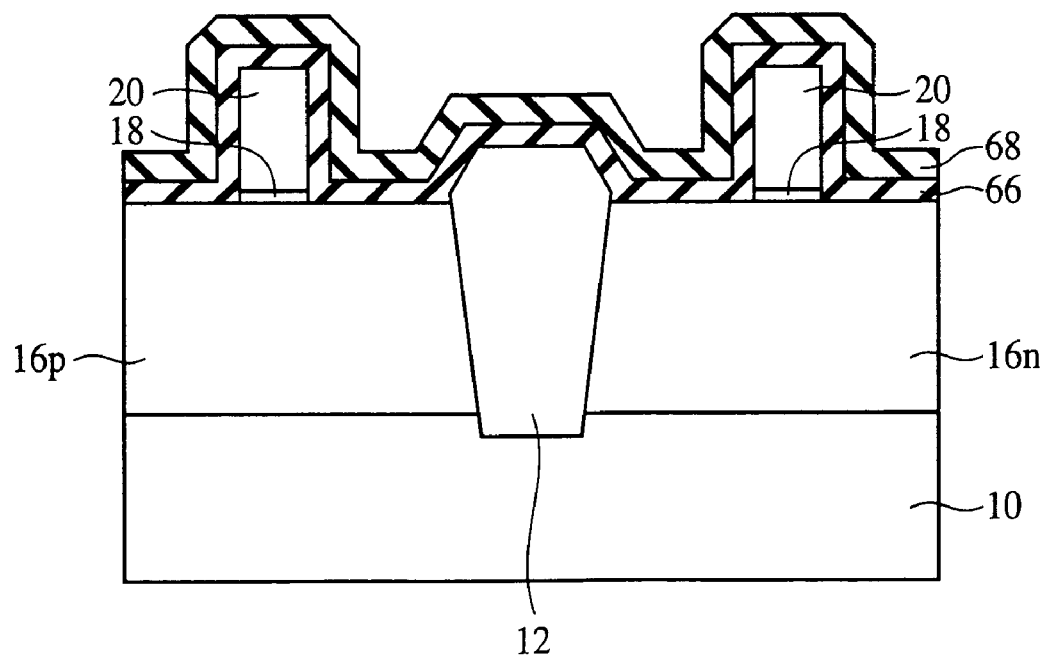

Then, as shown in FIG. 14B, a 10–30 nm-thickness silicon oxide film is formed on the entire surface by, e.g., thermal CVD. The raw materials are, e.g., TEOS and $O_2$. The film forming temperature is, e.g., 620–700° C. Because the dopant diffused regions 28, 36 forming the shallow regions of the extension source/drain structure have not been formed, the silicon oxide film 66 can be formed at such relatively high film forming temperature.

Then, a 40–80 nm-thickness silicon nitride film 68 is formed on the entire surface by, e.g., thermal CVD. The raw materials are, e.g., dichlorosilane and $NH_3$. The film forming temperature is, e.g., 700–800° C. Because the dopant diffused regions 28, 36 forming the shallow regions of the extension source/drain structure have not been formed, the silicon nitride film 66 can be formed without any problem at such relatively high film forming temperature.

Figure 15A:
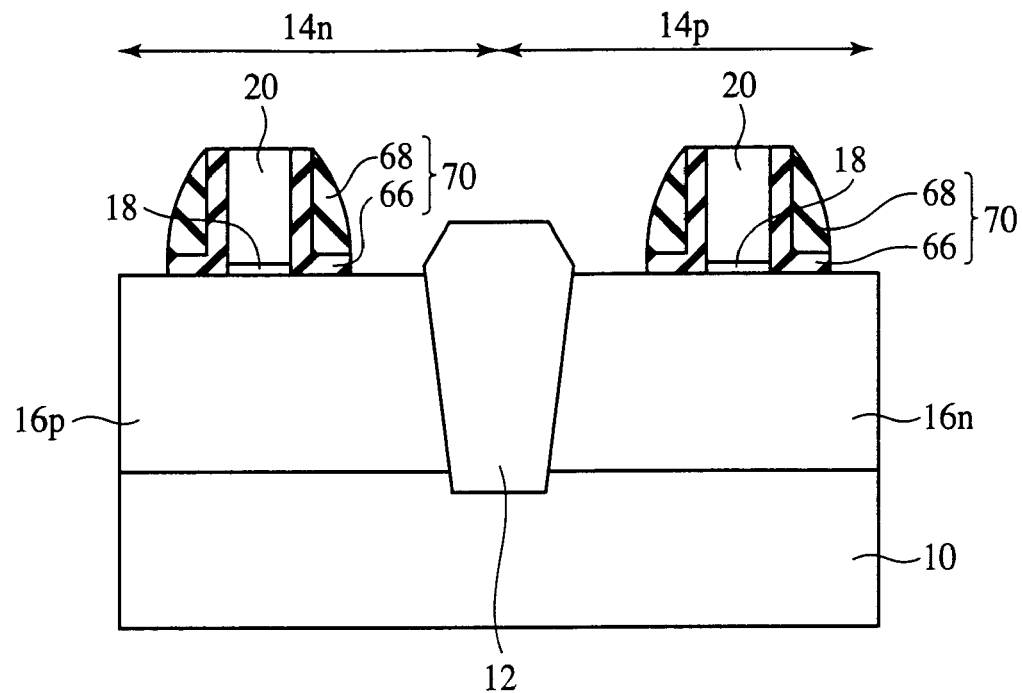
FIGS. 15A and 15B are sectional views of a semiconductor device in the steps of the semiconductor device fabrication method according to the second embodiment of the present invention, which show the method (Part 2).

Then, the silicon nitride film 68 and the silicon oxide film 66 are anisotropically etched. The etching gas is, e.g., hydrofluoro-carbon. Thus, as shown in FIG. 15A, sidewall spacers 70 of the layer structure of the silicon oxide film 66 and the silicon nitride film 68 are formed on the side walls of the gate electrodes 20.

Figure 15B:
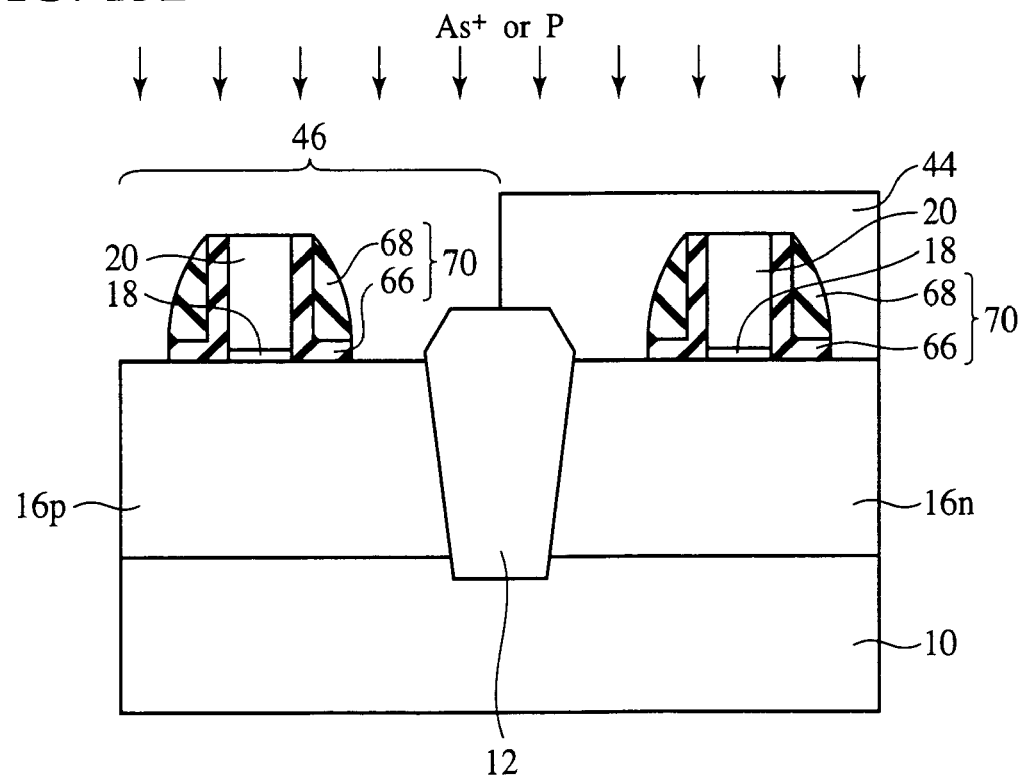
Figure 16A:
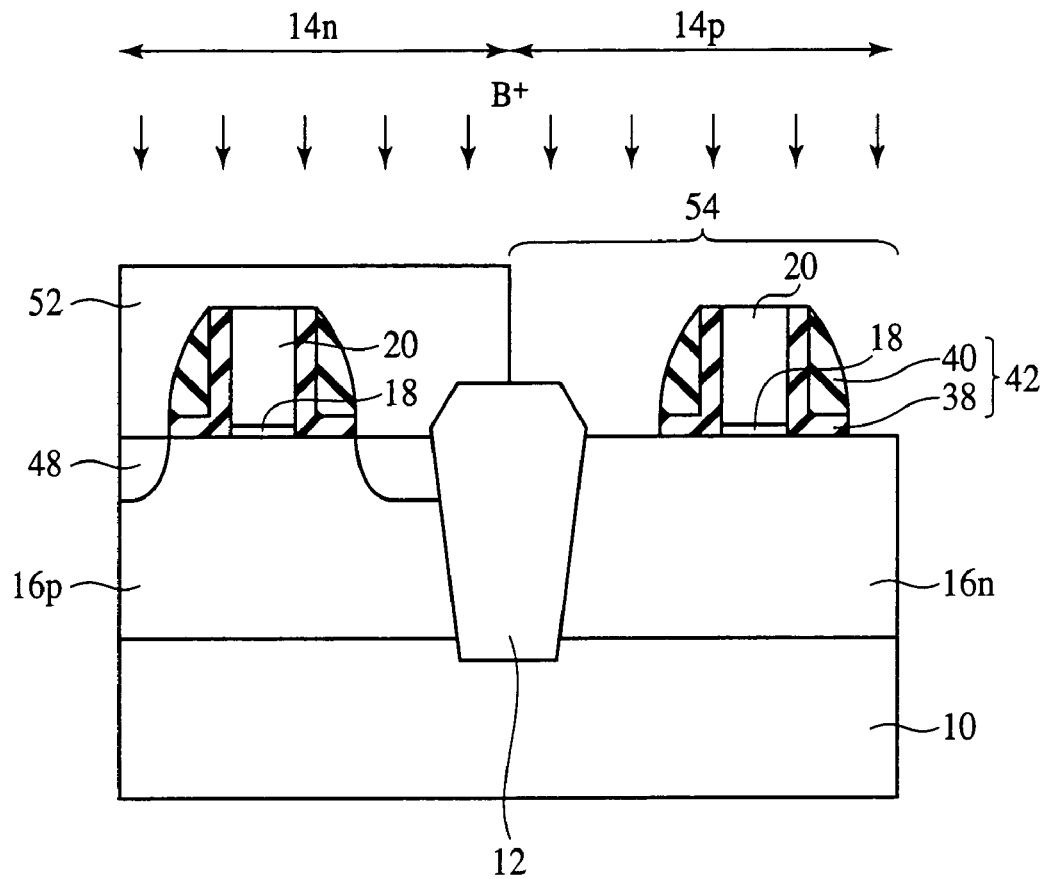
FIGS. 16A and 16B are sectional views of a semiconductor device in the steps of the semiconductor device fabrication method according to the second embodiment of the present invention, which show the method (Part 3).

The following steps of the semiconductor device fabrication method shown in FIGS. 15B and 16A are the same as those of the semiconductor device fabrication method described above with reference to FIGS. 6A and 6B, and their explanation will not be repeated.

Then, thermal processing for activating dopants implanted in the dopant diffused regions 48, 56 is performed by, e.g., RTA. The thermal processing is rapid annealing at, e.g., 1000° C. or higher.

Figure 16B:
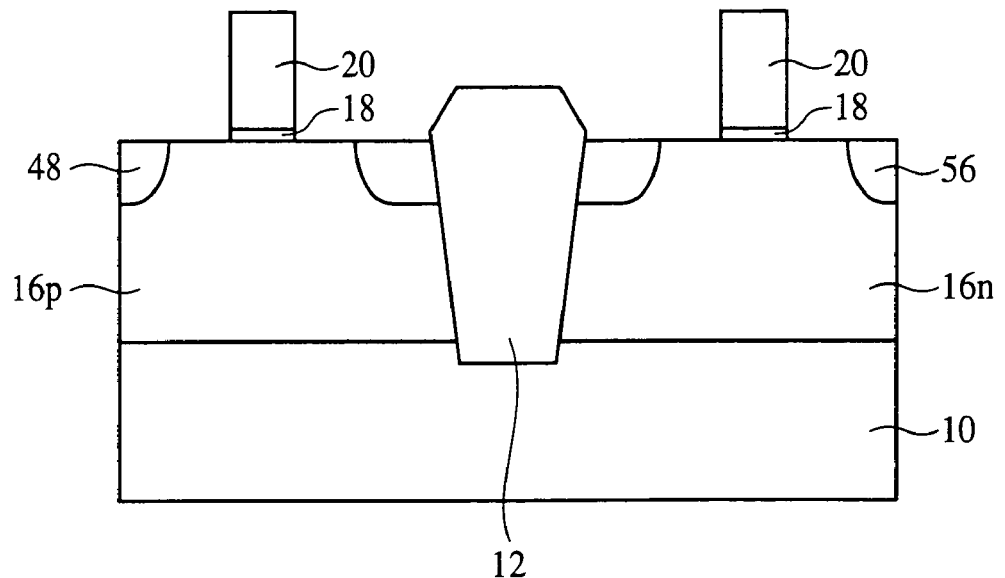
Figure 17A:
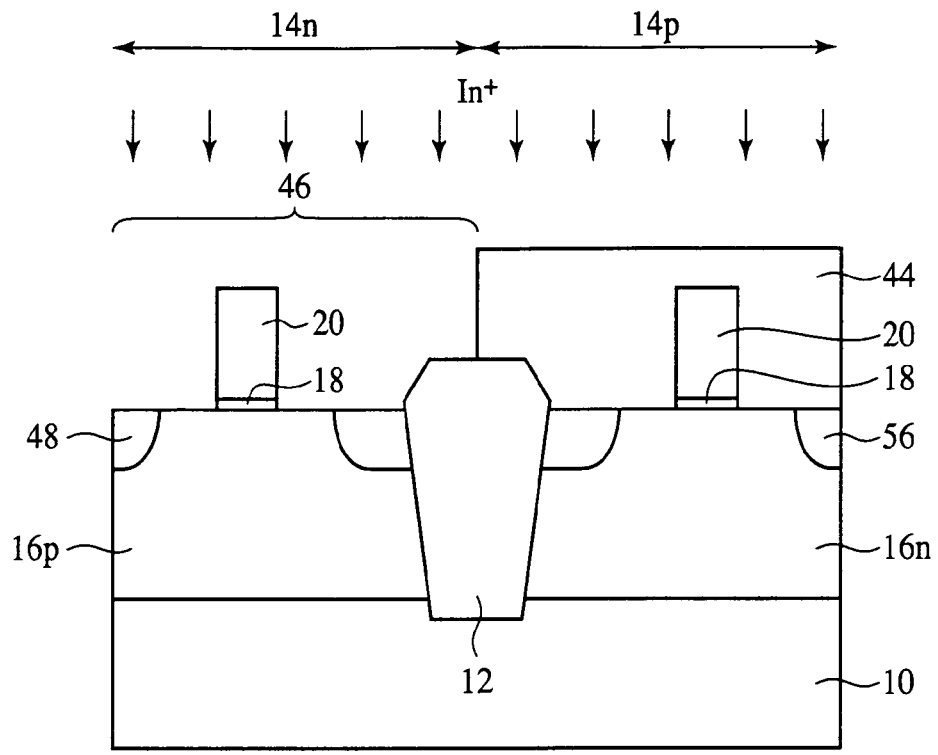
FIGS. 17A and 17B are sectional views of a semiconductor device in the steps of the semiconductor device fabrication method according to the second embodiment of the present invention, which show the method (Part 4).
Figure 17B:
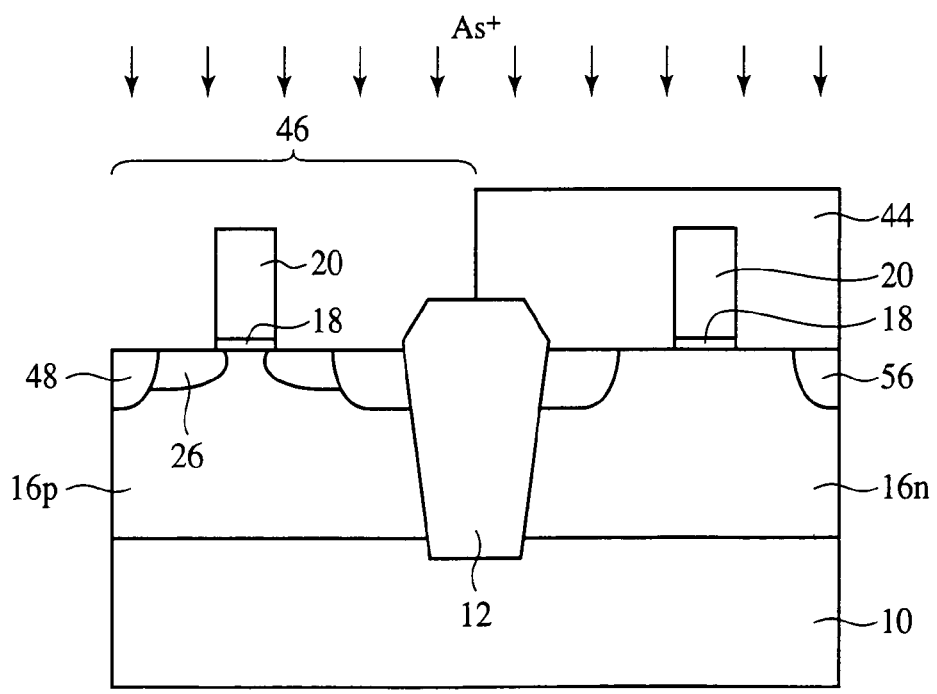
Figure 18A:
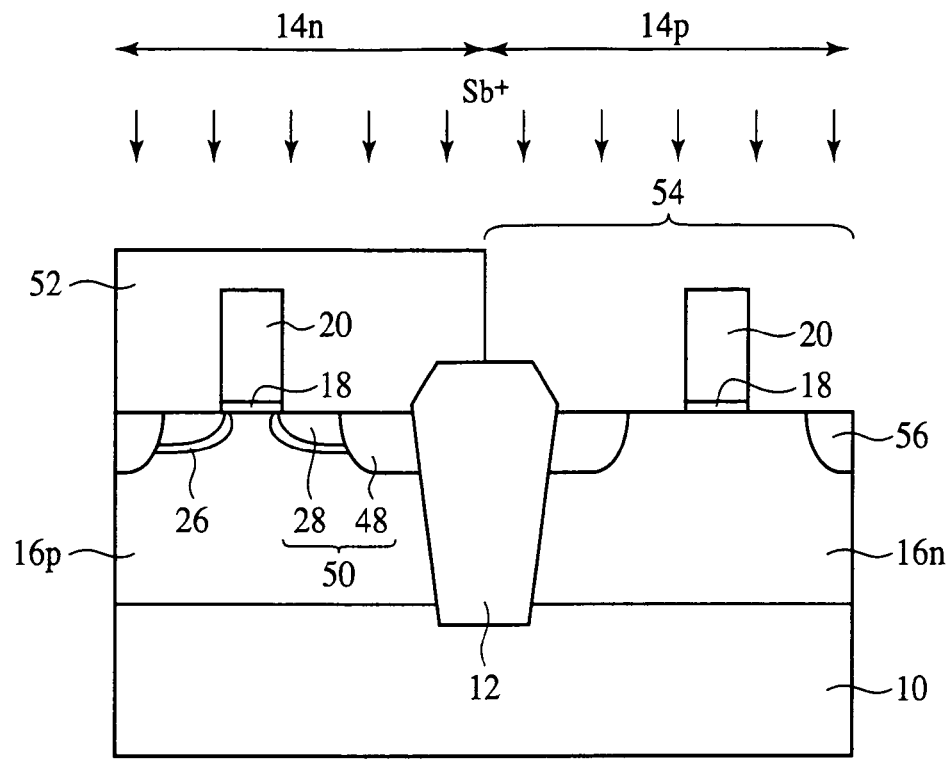
FIGS. 18A and 18B are sectional views of a semiconductor device in the steps of the semiconductor device fabrication method according to the second embodiment of the present invention, which show the method (Part 5).
Figure 18B:
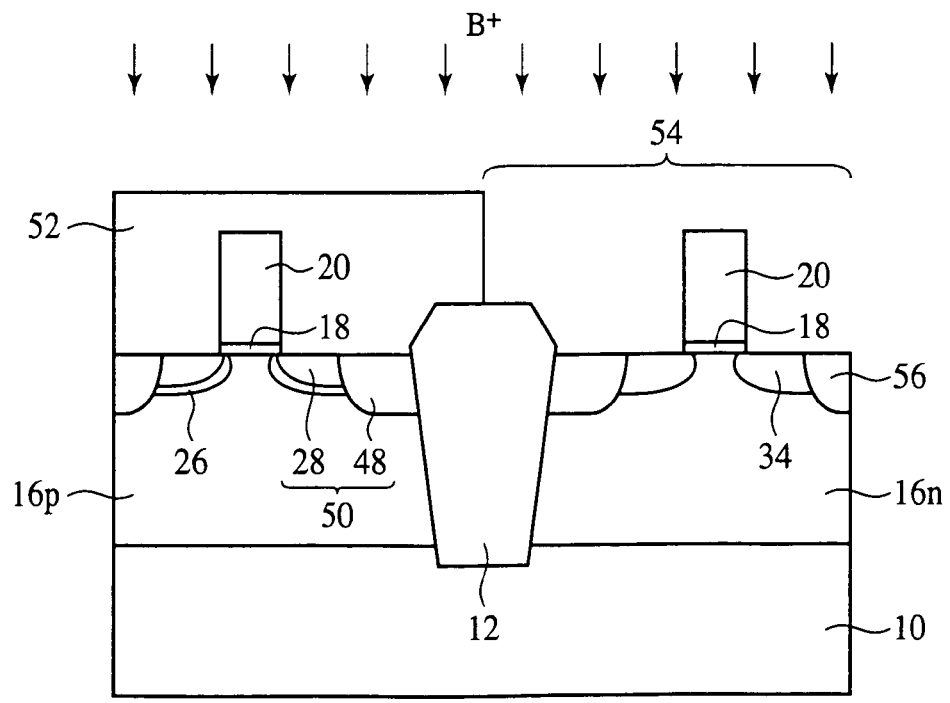

Then, the sidewall spacers 70 of the silicon oxide film 66 and the silicon nitride film 68 are etched off by, e.g., wet etching (refer to FIG. 16B). When the silicon nitride film 68 is etched, phosphoric acid, for example, is used. When the silicon oxide film 66 is etched, hydrofluoric acid, for example, is used.

The following steps of the semiconductor device fabrication method shown in FIGS. 17A to 18B are the same as those of the semiconductor device fabrication method described above with reference to FIGS. 1B to 3A, and their explanation will not be repeated.

Figure 19A:
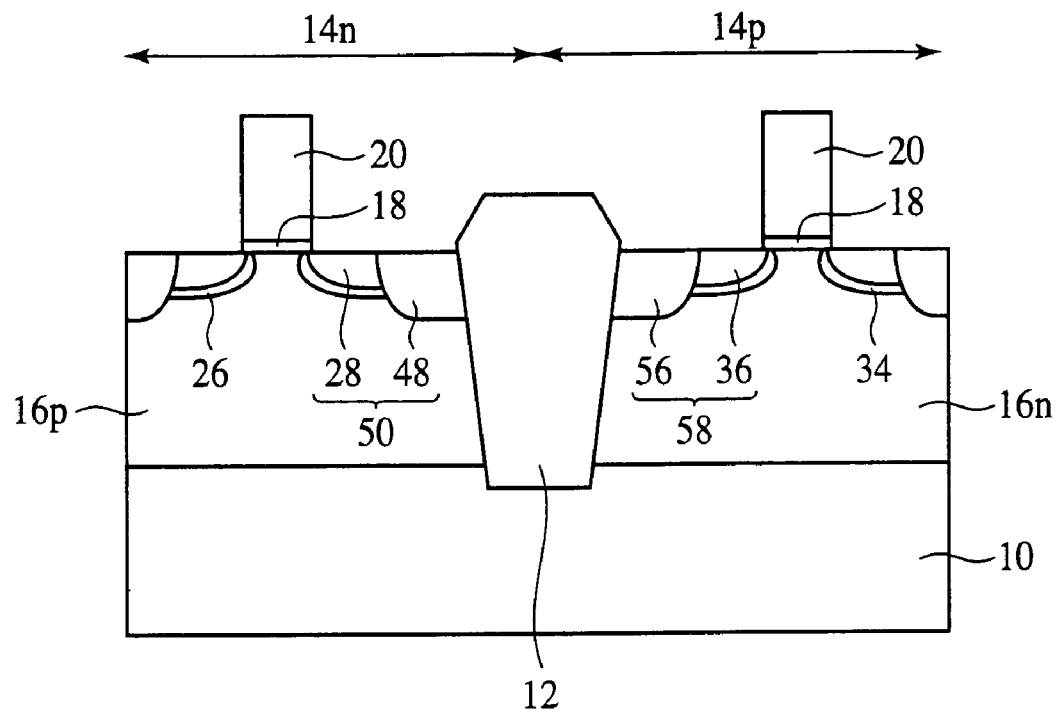
FIGS. 19A and 19B are sectional views of a semiconductor device in the steps of the semiconductor device fabrication method according to the second embodiment of the present invention, which show the method (Part 6).
Figure 19B:
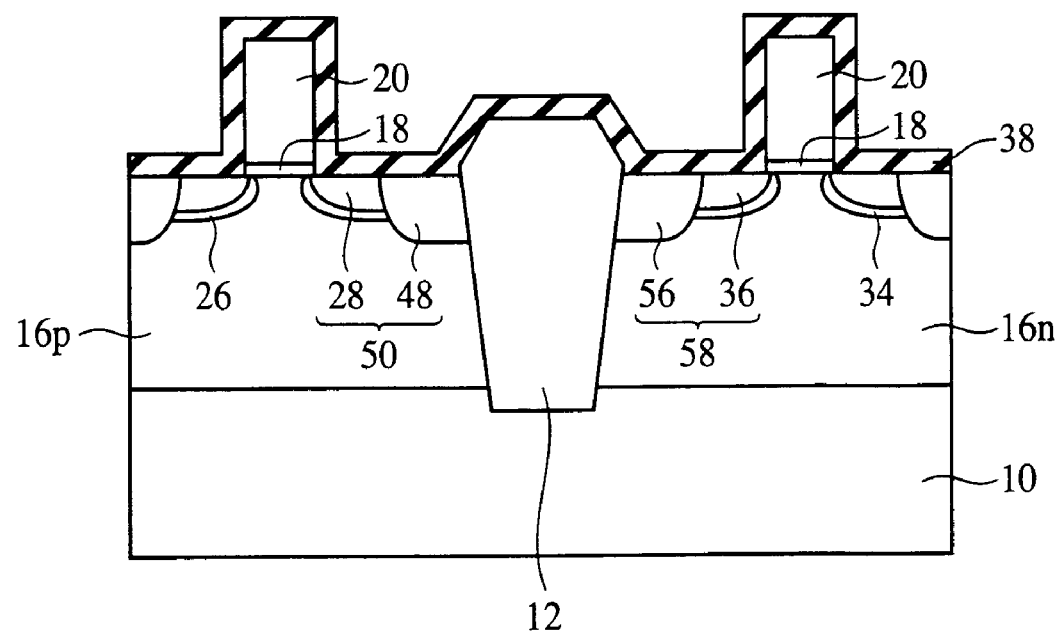
Figure 20A:
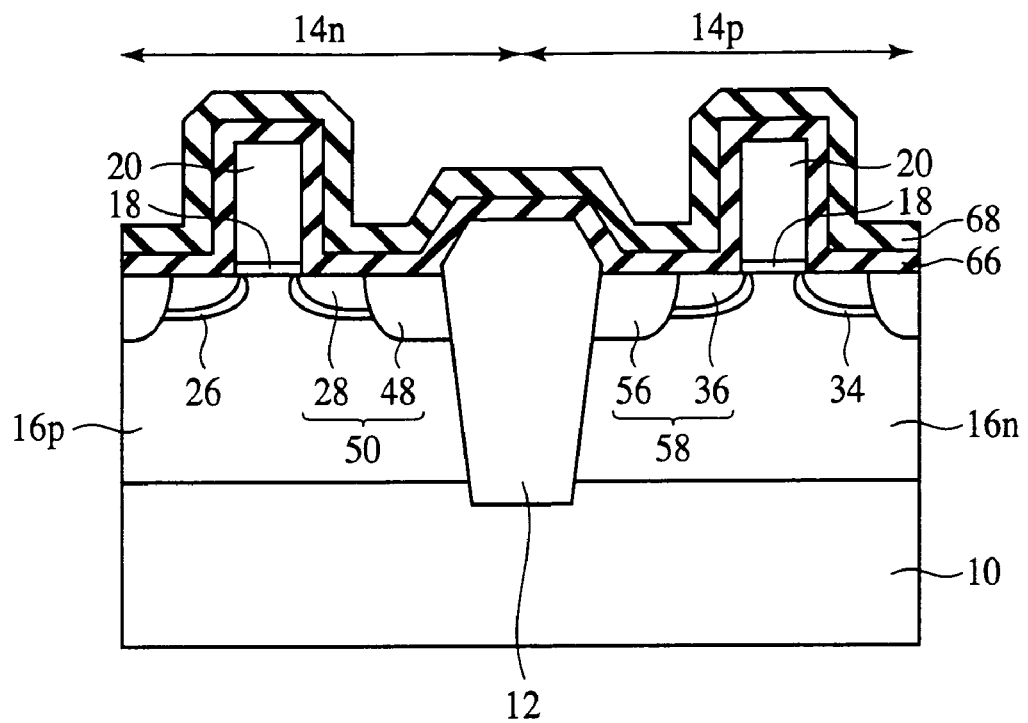
FIGS. 20A and 20B are sectional views of a semiconductor device in the steps of the semiconductor device fabrication method according to the second embodiment of the present invention, which show the method (Part 7).
Figure 20B:
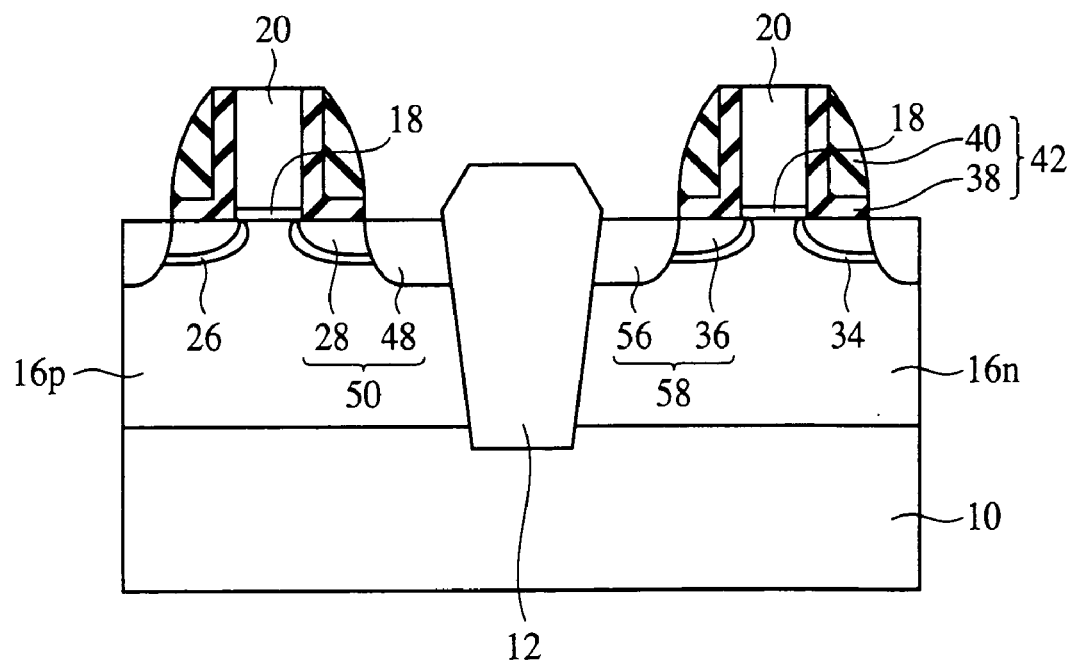

Then, thermal processing for activating dopants implanted in the pocket regions 26, 34 and the dopant diffused regions 28, 36 is performed by, e.g., RTA (refer to FIG. 19A). The thermal processing is rapid annealing at, e.g., 1000° C. or higher.

The following steps of the semiconductor device fabrication method shown in FIGS. 19B to 20B are the same as those of the semiconductor device fabrication method described above with reference to FIGS. 4A to 5B, and their explanation will not be repeated.

Figure 21A:
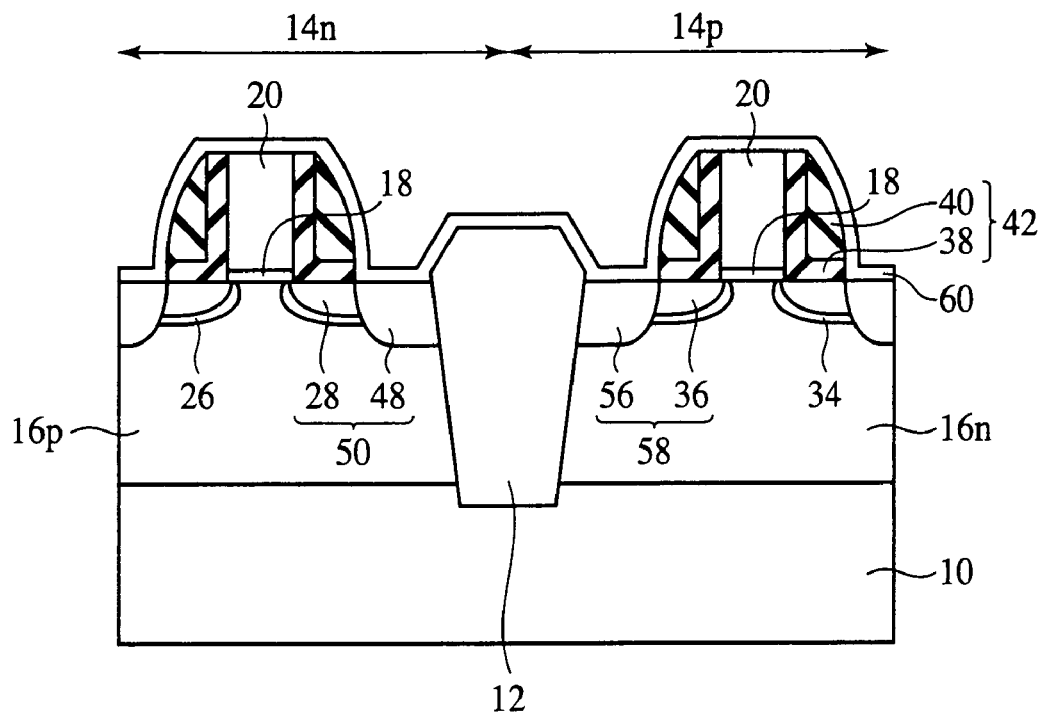
FIGS. 21A and 21B are sectional views of a semiconductor device in the steps of the semiconductor device fabrication method according to the second embodiment of the present invention, which show the method (Part 8).
Figure 21B:
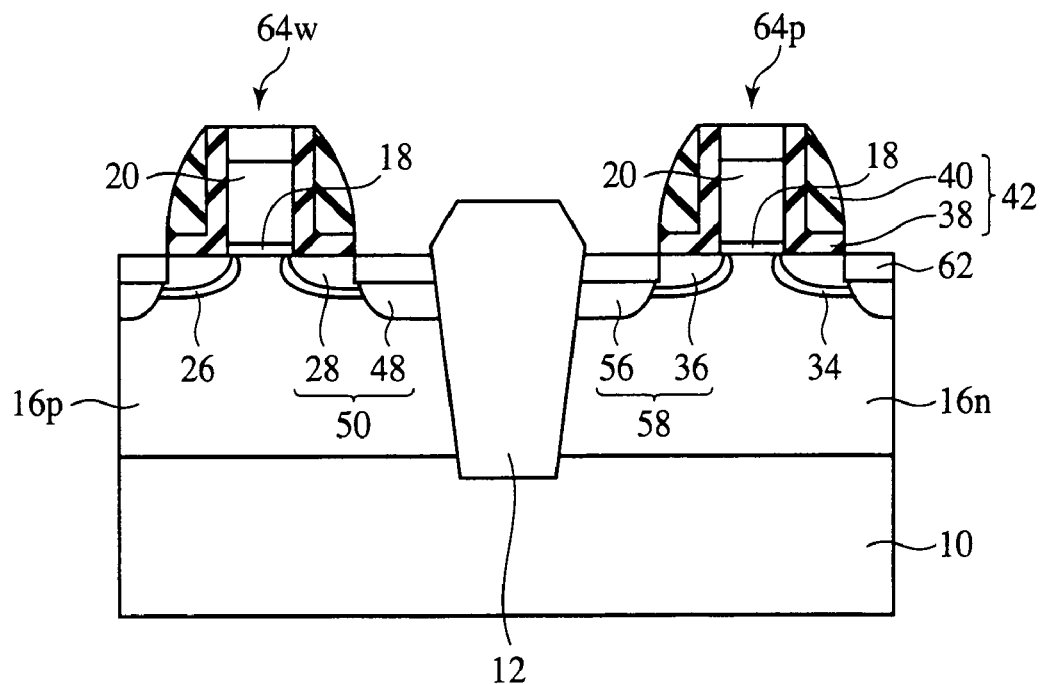

The following steps of the semiconductor device fabrication method shown in FIGS. 21A and 21B are the same as those of the semiconductor device fabrication method described above with reference to FIGS. 7B and 8, and their explanation will not be repeated.

Thus, the semiconductor device is fabricated by the semiconductor device fabrication method according to the present embodiment.

The semiconductor device according to the present embodiment is characterized mainly in that, as described above, the dopant diffused regions 48, 56 forming the deep region of the extension source/drain structure are formed before the dopant diffused regions 28, 36 forming the shallow regions of the extension source/drain structure and the pocket regions 26, 34 are formed.

According to the present embodiment, the dopant diffused regions 48, 56 forming the deep reign of the extension source/drain structure are formed before the dopant diffused regions 28, 36 forming the shallow region of the extension source/drain structure and the pocket regions 26, 34, which allows the thermal processing for activating dopants implanted in the deep dopant diffused regions 48, 56 to be performed before the shallow dopant diffused regions 28, 36 and the pocket regions 26, 34 are formed. According to the present embodiment, the diffusion of dopants in the dopant diffused regions 28, 36 forming the shallow region of the extension source/drain structure and the pocket regions 26, 34 can be suppressed, whereby the short channel effect and the current drive ability decrease of the transistors can be prevented.

(Modifications)

Figure 22A:
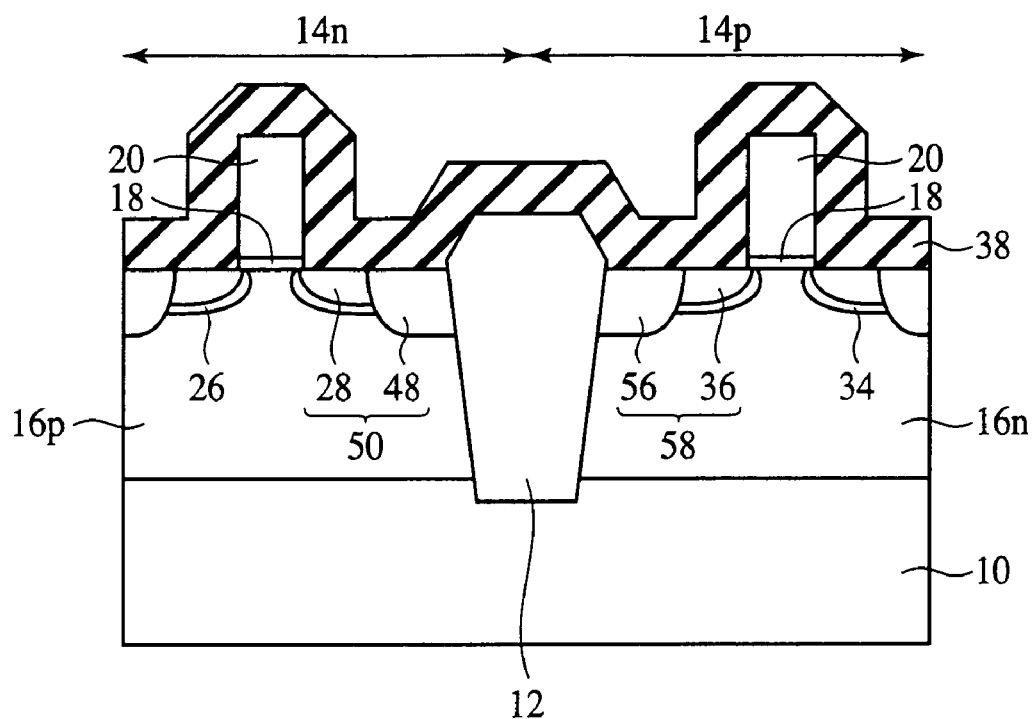
FIGS. 22A and 22B are sectional views of a semiconductor device in the steps of the semiconductor device fabrication method according to one modification of the second embodiment of the present invention, which show the method.
Figure 22B:
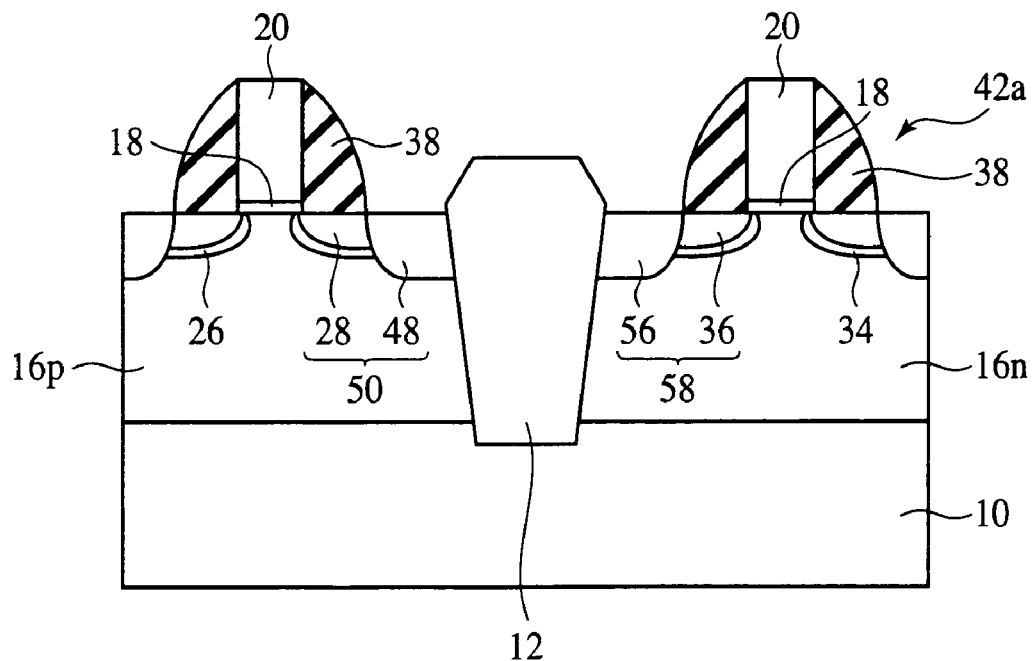

Then, a modification of the semiconductor device fabrication method according to the present embodiment will be explained with reference to FIGS. 22A and 22B. FIGS. 22A and 22B are sectional views of a semiconductor device in the steps of the semiconductor fabrication method according to the present modification, which show the method.

The semiconductor device fabrication method according to the present modification is characterized mainly in that the sidewall spacers 42a are formed of a silicon oxide film 38 alone.

The steps of performing thermal processing for activating the dopants implanted in the pocket regions 26, 34 and the dopant diffused regions 28, 36 are the same as those of the semiconductor device fabrication method described above with reference to FIGS. 14A to 19A, and their explanation will not be repeated.

Then, in the same way as in the semiconductor fabrication method described above with reference to FIG. 13A, an about 100 nm-thickness silicon oxide film 38 is formed on the entire surface (refer to FIG. 22A).

Then, in the same way as in the semiconductor device fabrication method described above with reference to FIG. 13B, the silicon oxide film 38 is anisotrptically etched. Thus, the sidewall spacer 42a of the single layer structure of the silicon oxide film 38 alone are formed on the side walls of the gate electrodes 20 (refer to FIG. 22B).

The following steps of the semiconductor device fabrication method are the same as those of the semiconductor fabrication method described above with reference to FIGS. 21A and 21B, and their explanation will not be repeated.

As described above, the sidewall spacers 42a maybe formed of the silicon oxide film 38 alone.

[A Third Embodiment]

Before the semiconductor device fabrication method according to a third embodiment of the present invention is explained, the principle of the semiconductor device fabrication method according to the third embodiment of the present invention will be explained.

The rate of the film forming reaction for forming a silicon nitride film by CVD using BTBAS and $NH_3$ as raw materials will be determined by 2 steps of feeding N—H to be the N source.

Figure 23:
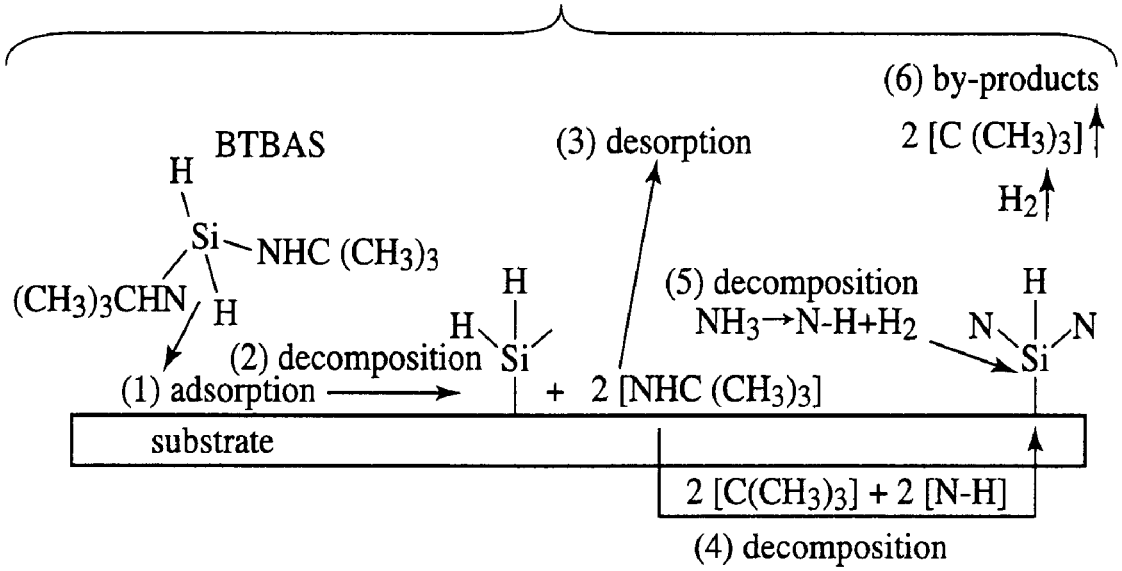
FIG. 23 is a conceptual view of the film forming mechanism for forming silicon nitride film, using BTBAS and $NH_3$ as the raw material gases.

FIG. 23 is a conceptual view of the film forming mechanism for forming silicon nitride film, using BTBAS and $NH_3$ as raw material gases.

The first step of feeding the N source is as follows.

First, as indicated by (1) in FIG. 23, BTBAS molecules are adsorbed on a semiconductor substrate. The BTBAS adsorbed on the semiconductor substrate is decomposed as indicated by (2) in FIG. 23. Specifically, the Si—NHC$(CH_3)_3$ bond, whose bond energy is lowest in the molecular structure of BTBAS, is severed to produce tertiary-butylamine. The produced tertiary-butylamine is decomposed as indicated by (4) in FIG. 23, and the N—H is the N source. Part of the produced tertiary-butylamine is desorbed from the semiconductor substrate as indicated by (3) in FIG. 23.

In the second step of feeding the N source, as indicated by (5) in FIG. 23, the $NH_3$ is decomposed, and the N—H is the N source.

As indicated by (6) in FIG. 23, the by-products are produced.

Based on the above, by using raw materials which easily provide the N source, the reaction rate will be higher, and silicon nitride film will be formed at relatively low film forming temperatures.

The inventors of the present application made earnest studies and have got the idea that a raw material containing a plurality of N atoms in a molecule is used in place of $NH_3$ as a raw material. Using a raw material containing a plurality of N atoms in a molecule will make it easier to provide the N source, make the reaction rate higher and permit silicon nitride film to be formed at relatively low film forming temperatures. Raw materials containing a plurality of nitrogen atoms in a molecule will be, e.g., hydrazine compounds, etc.

Figure 24:
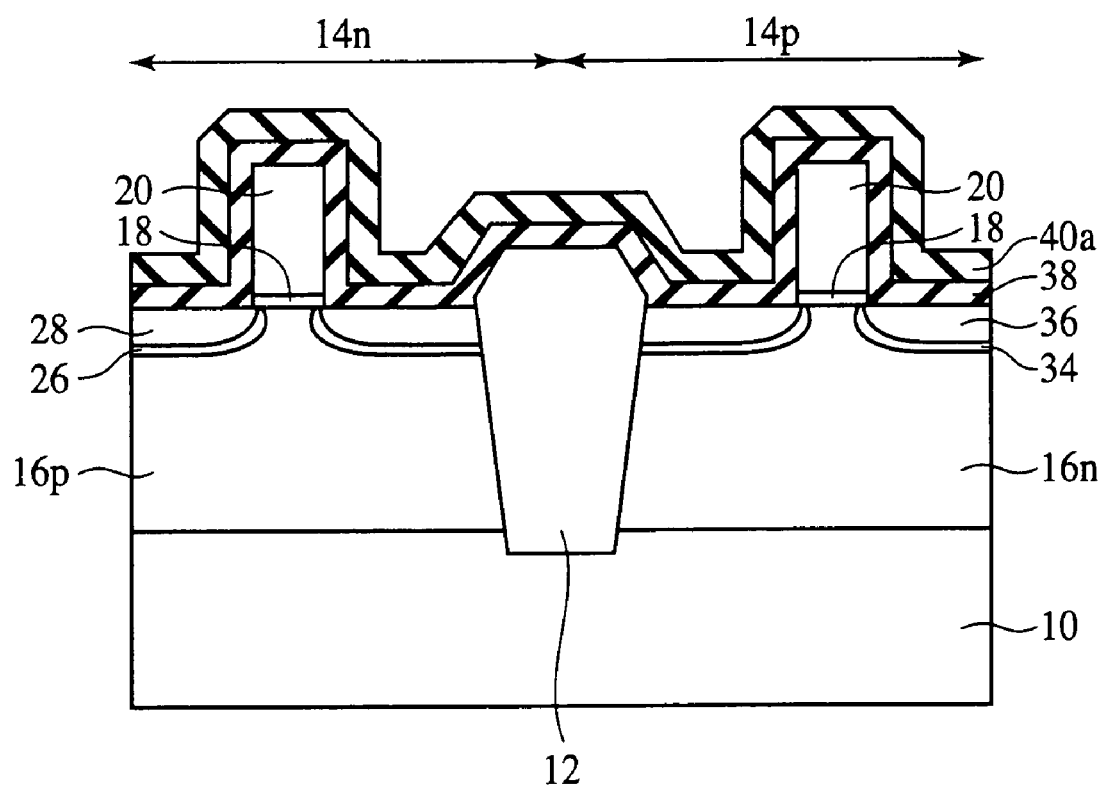
FIG. 24 is a sectional view of a semiconductor device in the steps of the semiconductor device fabrication method according to a third embodiment of the present invention, which shows the method.

Next, the semiconductor device fabrication method according to the third embodiment of the present invention will be explained with reference to FIGS. 24 to 28. FIG. 24 is a sectional view of a semiconductor device in a step of the semiconductor device fabrication method according to the present embodiment, which explains the method. The same members of the present embodiment as those of the semiconductor device fabrication method according to the first and the second embodiments shown in FIGS. 1A to 23 are represented by the same reference numbers not to repeat or to simplify their explanation.

The steps of the present embodiment up to the step of forming the silicon oxide film 38 including the silicon oxide film 38 forming step are the same as those of the semiconductor device fabrication method described above with reference to FIGS. 1A to 4A, and their explanation will not be repeated.

Then, as shown in FIG. 24, a 40–80 nm-thickness silicon nitride film is formed on the entire surface by, e.g., thermal CVD. The raw materials are a raw material formed of a compound containing silicon and nitrogen, and a compound containing a plurality of nitrogen atoms in a molecule. The raw material containing silicon and nitrogen can be, e.g., BTBAS. The raw material containing a plurality of nitrogen atoms in a molecule can be, e.g., a hydrazine compound. The hydrazine compound can be, e.g., DMHy (Dimethylhydrazine, $(CH_3)_2HNNH_2$). The film forming temperature is, e.g., 500–650° C. The pressure in the film forming chamber is, e.g., 100 Torr. The flow rate of BTBAS is, e.g., 10–100 sccm. The flow rate of dimethylhydrazine is, e.g., 30–300 sccm. The period of the film forming time is, e.g., 10–20 minutes.

The film forming temperature for forming the silicon nitride film 40a is here 500–650° C. but is not essentially limited to 500–650° C. The silicon nitride film 40a can be formed at, e.g., a temperature below 500° C. In order to ensure the suppression of the diffusion of dopants in the dopant diffused regions 28, 36 forming the shallow region of the extension source/drain and the pocket regions 26, 34, it is preferable to form the silicon nitride film 40a at, e.g., a temperature of below 550° C.

The following steps of the semiconductor device fabrication method are the same as those of the semiconductor device fabrication method described above with reference to FIGS. 5A to 8, and their explanation will not be repeated.

Thus, the semiconductor device is fabricated by the semiconductor device fabrication method according to the present embodiment.

The semiconductor device fabrication method according to the present embodiment is characterized mainly in that, as described above, the silicon nitride film 40a is formed, using a raw material of a compound containing silicon and nitrogen and a raw material of a compound containing a plurality of nitrogen atoms in a molecule.

According to the present embodiment, the silicon nitride film 40a is formed by using a raw material of a compound containing silicon and nitrogen and a raw material of a compound containing a plurality nitrogen atoms in a molecule, whereby the silicon nitride film 40a can be formed by thermal CVD at relative low film forming temperatures. Thus, according to the present embodiment, the diffusion of dopants in the shallow dopant diffused regions 28, 36 forming the extension source/drain structure and the pocket regions 26, 34 can be suppressed. Accordingly, the short channel effect and the current drive ability decrease of the transistors can be prevented. The roll-off resistance can be also improved. Thus, according to the present embodiment, micronized semiconductor devices having good electric characteristics can be provided.

(Evaluation Result)

Then, the evaluation of the semiconductor device fabrication method according to the present embodiment will be explained with reference to FIGS. 25 to 28.

Figure 25:
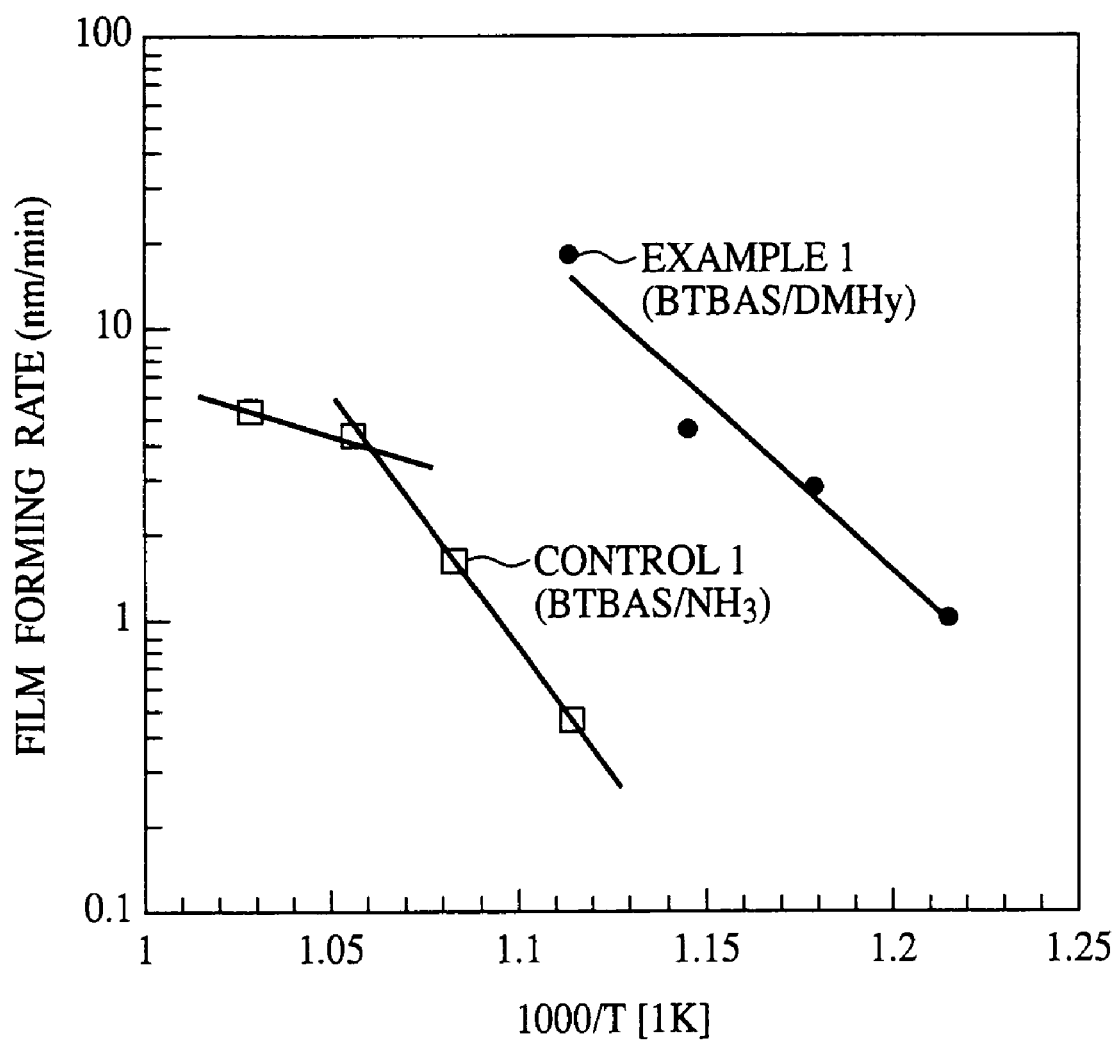
FIG. 25 is a graph of the film forming rate of silicon nitride film.

FIG. 25 is a graph of film forming rates of silicon nitride film. FIG. 25 is an Arrhenius plot. Inverses of temperatures are taken on the horizontal axis, and film forming rates are taken on the vertical axis.

In FIG. 25, Control 1 represented by "□" marks indicates film forming rates of silicon nitride film formed, using BTBAS and $NH_3$ as the raw material gases. When silicon nitride film is formed, using BTBAS and $NH_3$ as the raw material gases, the film forming rate is controlled by the reaction controlling at relatively high film forming temperatures, and at relatively low film forming temperatures, the film forming rate is controlled by the transport controlling. The apparent activation energy was 3.3 eV at the reaction controlling and 0.65 eV at the transport controlling.

In FIG. 25, Example 1 represented by "●" marks indicates the film forming rates of the silicon nitride film formed by the semiconductor device fabrication method according to the present embodiment, i.e., using BTBAS and dimethylhydrazine (DMHy) as the raw material gases. The appararent activatinenergy was 2.3 eV.

As seen in FIG. 25, Example 1 has higher film forming rates higher by one or more figures than Control 1. When the film forming temperatures for the film forming rate of 5 nm/min are compared, it can be seen that Example 1 can lower the film forming temperature by more than 100° C. than Control 1.

Based on this, according to the present embodiment, silicon nitride film can be formed at very low film forming temperatures.

Figure 26:
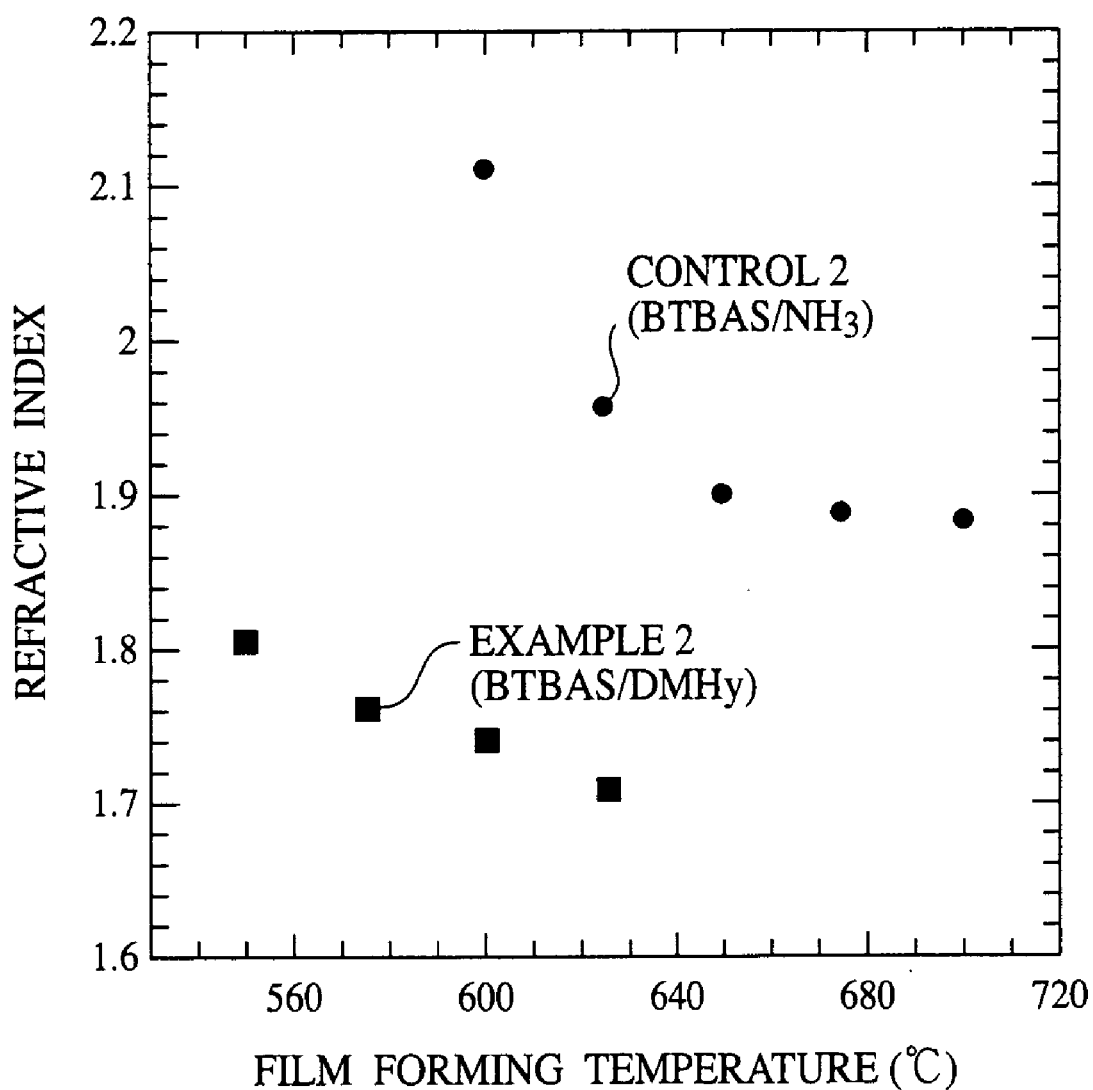
FIG. 26 is a graph of relationships between the film forming temperature and refractive index of silicon nitride film.

FIG. 26 is a graph of relationships between the film forming temperatures of silicon nitride film and refractive indexes. Film forming temperatures for forming the silicon nitride film were taken on the horizontal axis, and refractive indexes of the silicon nitride film were taken on the vertical axis.

In FIG. 26, Example 2 represented by "■" marks indicates refractive indexes of silicon nitride film formed by the semiconductor fabrication method according to the present embodiment, i.e., formed, using BTBAS and dimethylhydrazine (DMHy) as the raw material gases.

In FIG. 26, Control 2 represented by "●" marks indicates refractive indexes of silicon nitride film formed by, using BTBAS and $NH_3$ as the raw material gases.

Both in Example 2 and Control 2, here is a tendency that as silicon nitride film is formed at higher film forming temperatures, the silicon nitride film has lower refractive indexes. Silicon nitride film having lower refractive indexes as the silicon nitride film is formed at higher film forming temperatures will be due to the tendency that as the film forming temperature is higher, the silicon concentration in the silicon nitride film becomes lower than that of the stoichiometric composition ($Si_3N_4$), and the nitrogen concentration in the silicon nitride film becomes higher than that of the stoichiometric composition. This agrees with the analysis result by FTIR.

Bulk $Si_3N_4$ of the stoichiometric composition has an about 43% silicon concentration. Bulk $Si_3N_4$ of the stoichiometric composition has an about 2.0–2.1 refractive index.

Figure 27:
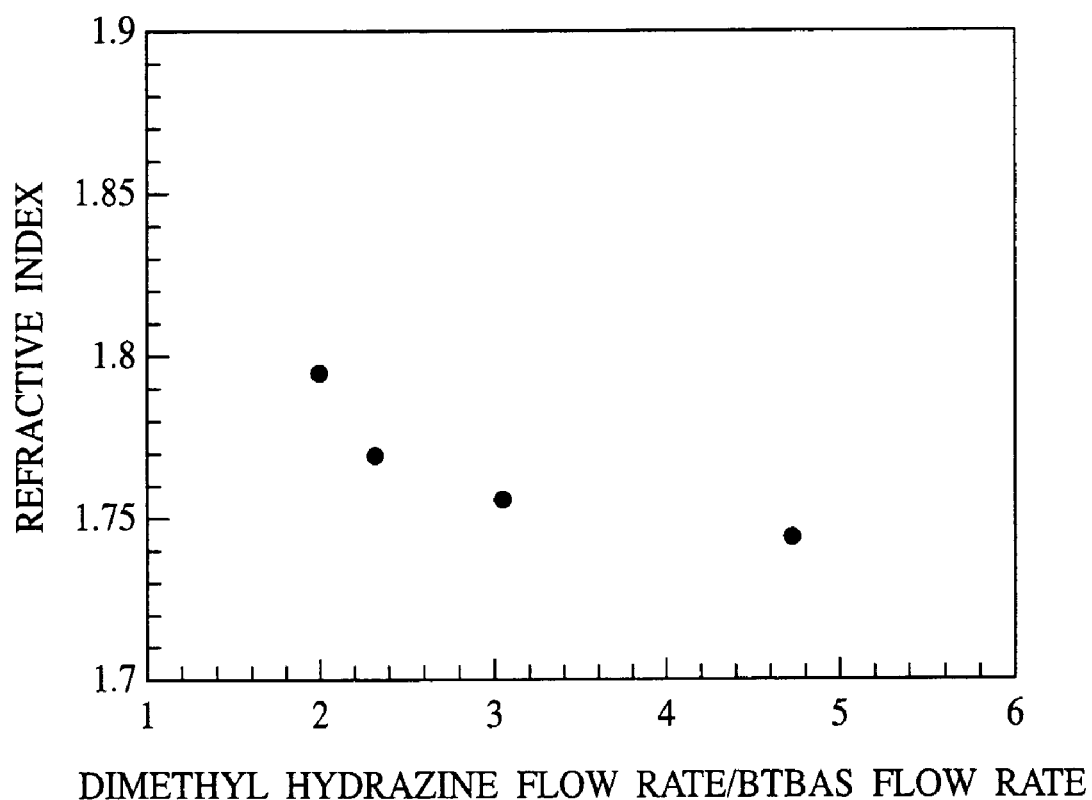
FIG. 27 is a graph of relationships between the flow rate of the raw material gases and the refractive index of silicon nitride film.

FIG. 27 is a graph of relationships between flow rate ratios of the raw material gases, and refractive indexes of silicon nitride film. The ratios of flow rates of dimethylhydrazine to flow rates of BTBAS are taken on the horizontal axis, and the refractive indexes of the silicon nitride film are taken on the vertical axis.

As seen in FIG. 27, there is a tendency that as the flow rate of dimethylhydrazine is higher, the refractive index of silicon nitride film becomes lower. The refractive index becoming lower as the flow rate ratio of dimethylhydrazine is higher will be due to that as the flow rate of the dimethylhydrazine is higher, the film forming rate becomes higher, but the film density of the formed silicon nitride film becomes lower.

Preferably the film density of the silicon nitride film is higher, because when the film density of the silicon nitride film is low, dopants implanted in the gate electrodes 20 and in the semiconductor substrate 10 are often diffused into the silicon nitride film. Accordingly, it is preferable that the flow rate of dimethylhydrazine to the flow rate of BTBAS is below, e.g., 3 times.

Figure 28:
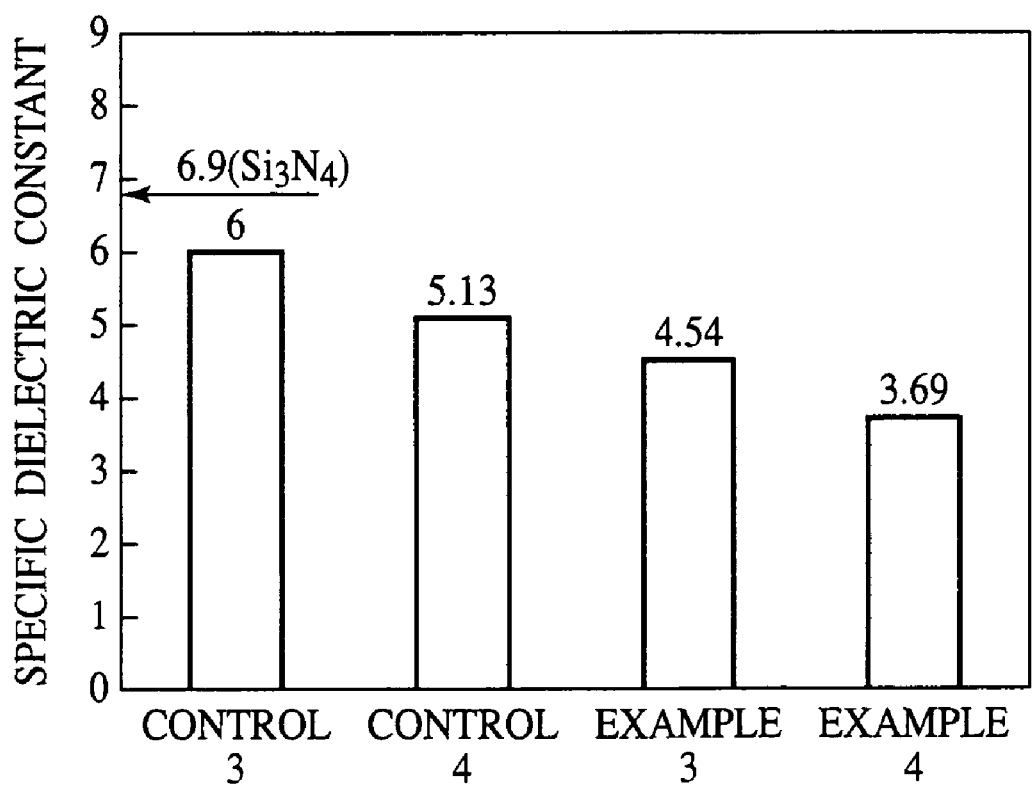
FIG. 28 is a graph of specific dielectric constant of silicon oxide film.

FIG. 28 is a graph of specific dielectric constants of silicon nitride film.

In Control 3, specific dielectric constants of silicon nitride film formed at a film forming temperature of 700° C., using dichlorosilane and $NH_3$ as raw material gases. The film forming system was a vertical CVD system.

In Control 4, specific dielectric constants of silicon nitride film formed at a film forming temperature of 580° C., using BTBAS and $NH_3$ as the raw material gases. The film forming system was a vertical CVD system.

In Example 3, nitride film was formed at a film forming temperature of 500° C., using BTBAS and dimethylhydrazine and $NH_3$ as the raw material gases. The film forming system was a single wafer CVD system.

The bulk $Si_3N_4$ has a specific dielectric constant of 6.9.

In Example 4, specific dielectric constants of silicon nitride film formed at a film forming temperature of 500° C., using BTBAS and dymethylhdrazine as the raw material gases. The film forming system was a single wafer CVD system.

As seen in FIG. 28, in Examples 3 and 4, silicon nitride film had lower specific dielectric constants than in Controls 3 and 4.

In comparison between Examples 3 and 4, silicon nitride film had lower dielectric constant in Example 4 than in Example 3.

Based on this, the present embodiment can make the specific dielectric constant of silicon nitride film low, whereby the dielectric capacitance between the gate electrodes and the silicon nitride film can be made small. Accordingly, the present embodiment can further improve the operational speed of semiconductor devices.

(Modifications)

Figure 29:
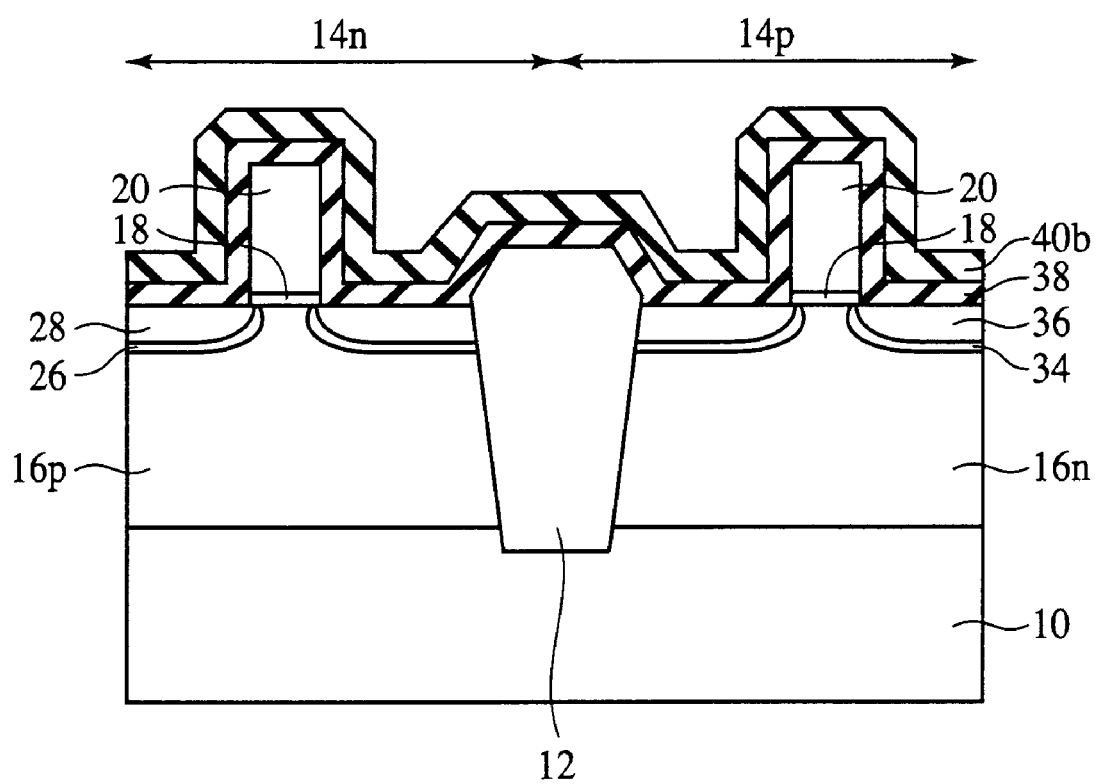
FIG. 29 is a sectional view of a semiconductor device in the steps of the semiconductor device fabrication method according to one modification of the third embodiment of the present invention, which shows the method.

Next, modifications of the semiconductor device according to the present embodiment will be explained with reference to FIGS. 29 and 30. FIG. 29 is a sectional view of a semiconductor device in a step of the semiconductor device fabrication method according to one modification, which shows the method.

The semiconductor device fabrication method according to the present modification is characterized mainly in that in addition to a raw material of a compound containing silicon and nitrogen, and a raw material containing a compound containing a plurality of nitrogen atoms in a molecule, a raw material of $NH_3$ is further used to form the silicon nitride film.

The steps up to the step of forming a silicon oxide film 38 including the silicon oxide film 38 forming step are the same as those of the semiconductor fabrication method described above with reference to FIGS. 1A to 4A, and their explanation will not be repeated.

Then, as shown in FIG. 29, a silicon nitride film 40b of a 40–80 nm-film thickness is formed on the entire surface by, e.g., thermal CVD. As the raw materials, a raw material of a compound containing silicon and nitrogen, a raw material of a compound containing a plurality of nitrogen atoms in a molecule and a raw material of $NH_3$ are used. The raw material of a compound containing silicon and nitrogen can be, e.g., BTBAS, as described above. The raw material of a compound containing a plurality of nitrogen atoms in a molecule can be, e.g., a hydrazine compound, as described above. The hydrazine compound can be, e.g., dimethylhydrazine, as described above. The film forming temperature is, e.g., 500–650° C. The pressure in the firm forming chamber is, e.g., 100 torr. The flow rate of the BTBAS is, e.g., 10–100 sccm. The flow rate of the dimethylhydrazine is, e.g., 30–300 sccm. The flow rate of the $NH_3$ is, e.g., 30–300 sccm. The period of film forming time is, e.g., 10–20 minutes.

The following steps of the semiconductor device fabrication method according to the present modification are the same as those of the semiconductor device fabrication method described above with reference to FIGS. 5A to 8, and their explanation will not be repeated.

Thus, semiconductor device is fabricated by the semiconductor device fabrication method according to the present modification.

As described above, the silicon nitride film 40b may be formed using a raw material of $NH_3$ in addition to a raw material of a compound of silicon and nitrogen and a raw material of a compound containing a plurality of nitrogen atoms in a molecule.

(Evaluation Result)

The evaluation result of the semiconductor device fabrication method according to the present modification will be explained with reference to FIG. 30. FIG. 30 is a graph of leak current characteristics of silicon nitride film. Electric field strengths are taken on the horizontal axis, and leak current densities are taken on the vertical axis.

Example 5 shows leak current densities of silicon nitride film formed by the present modification, using BTBAS, dimethylhydrazine and $NH_3$ as the raw materials.

Control 5 shows leak current densities of silicon nitride film formed using BTBAS and dimethylhydrazine as the raw materials.

Figure 30:
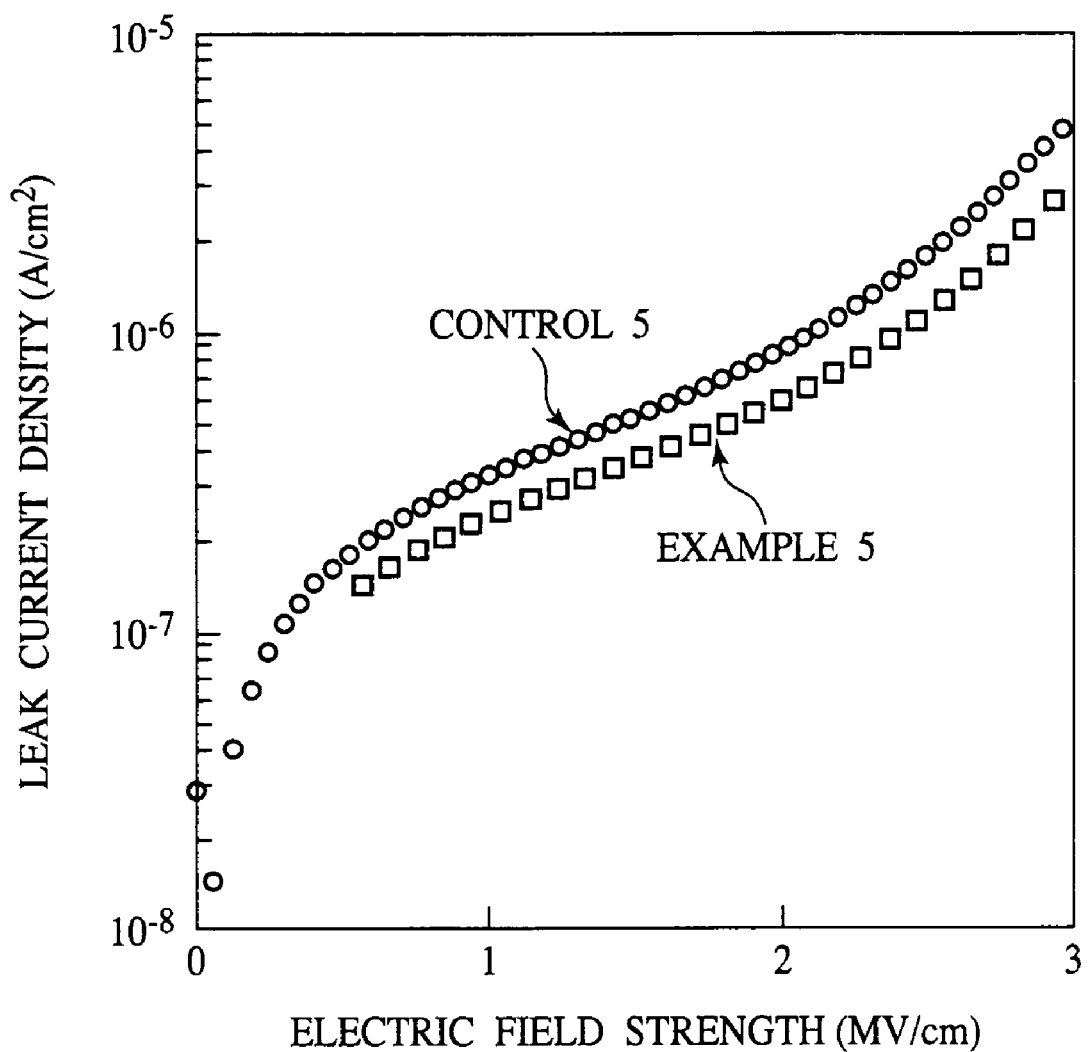
FIG. 30 is a graph of leak current characteristics of silicon nitride film.

As seen in FIG. 30, the leak current of the silicon nitride film is lower in Example 5 than in Control 5.

As described above, according to the present modification, the leak current of the silicon nitride film can be reduced.

[A Fourth Embodiment]

Next, the semiconductor device fabrication method according to a fourth embodiment of the present invention will be explained with reference to FIGS. 31A to 33. FIGS. 31A to 33 are sectional views of a semiconductor device in the steps of the semiconductor device fabrication method according to a fourth embodiment, which show the method. The same members of the present embodiment as those of the semiconductor device fabrication method according to the first to the third embodiments shown in FIGS. 1A to 30 are represented by the same reference numbers not to repeat or to simplify their explanation.

The semiconductor device fabrication method according to the present embodiment is characterized mainly in that when a cap film or a stopper film are formed of SiN, SiCN or SiOCN, the film is formed in the same way as described above, using a raw material of a compound containing silicon and nitrogen and a raw material of a compound containing a plurality of nitrogen atoms in a molecule.

Figure 31A:
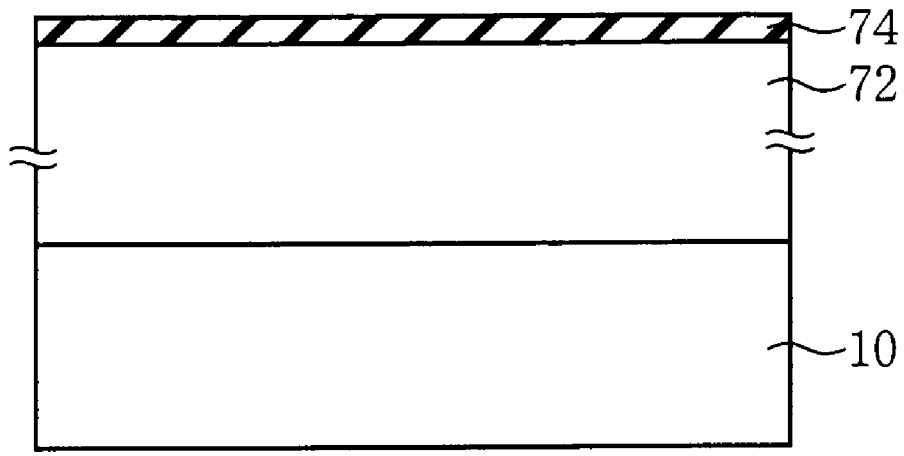
FIGS. 31A and 31B are sectional views of a semiconductor device in the steps of the semiconductor device fabrication method according to a fourth embodiment of the present invention, which show the method (Part 1).

First, as shown in FIG. 31A, an inter-layer insulation film 72 of a 400–800 nm-thickness FSG (Fluorine doped Silicate Glass) is formed by, e.g., plasma enhanced CVD on the entire surface of a semiconductor substrate 10 with transistors (not shown) formed on.

Then, a cap layer 74 of a 30–100 nm-thickness SiN film, SiCN film or SiOCN film is formed on the entire surface. The cap film 74 functions as, e.g., a passivation film. When an SiN film as the cap film 74 is formed, the cap film 74 can be formed in the same way as the silicon nitride film 40a described above with reference to FIG. 24 is formed. When an SiCN film is used as the cap film 74, a raw material gas containing carbon (C) can be used as the raw material gas. When an SiOCN film is used as the cap film 74, oxygen gas is suitably fed into the film forming chamber.

Figure 31B:
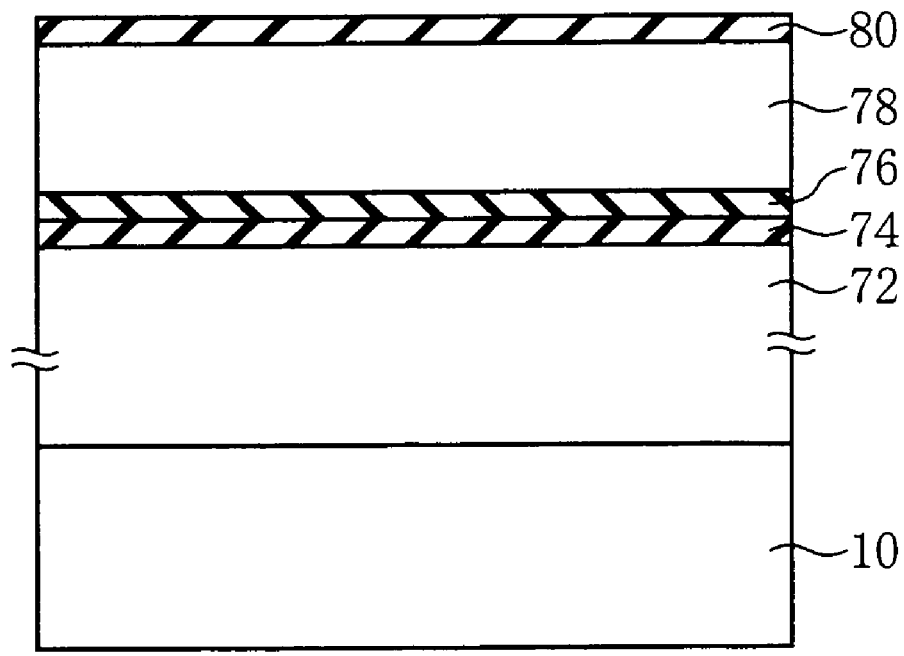
Figure 32A:
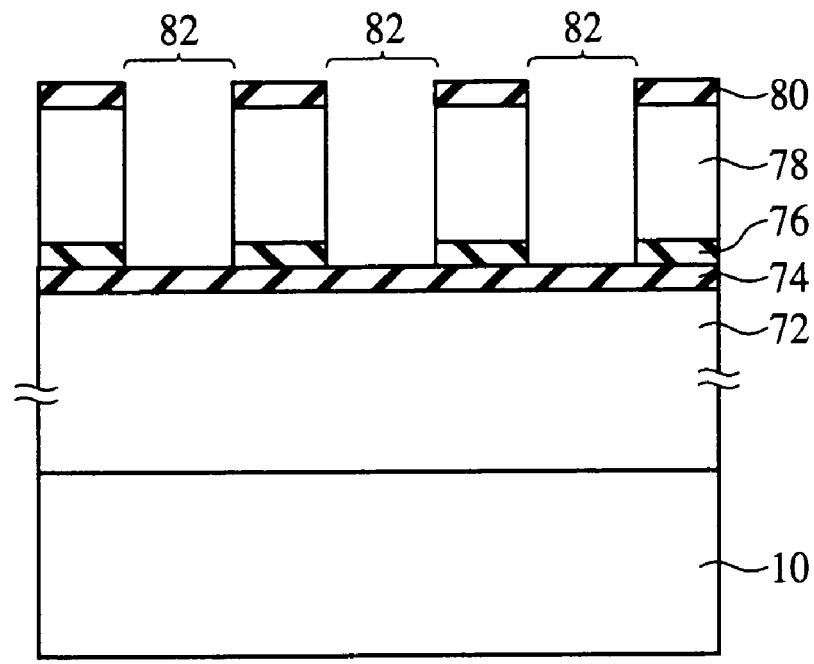
FIGS. 32A and 32B are sectional views of a semiconductor device in the steps of the semiconductor device fabrication method according to the fourth embodiment of the present invention, which shows the method (Part 2).
Figure 32B:
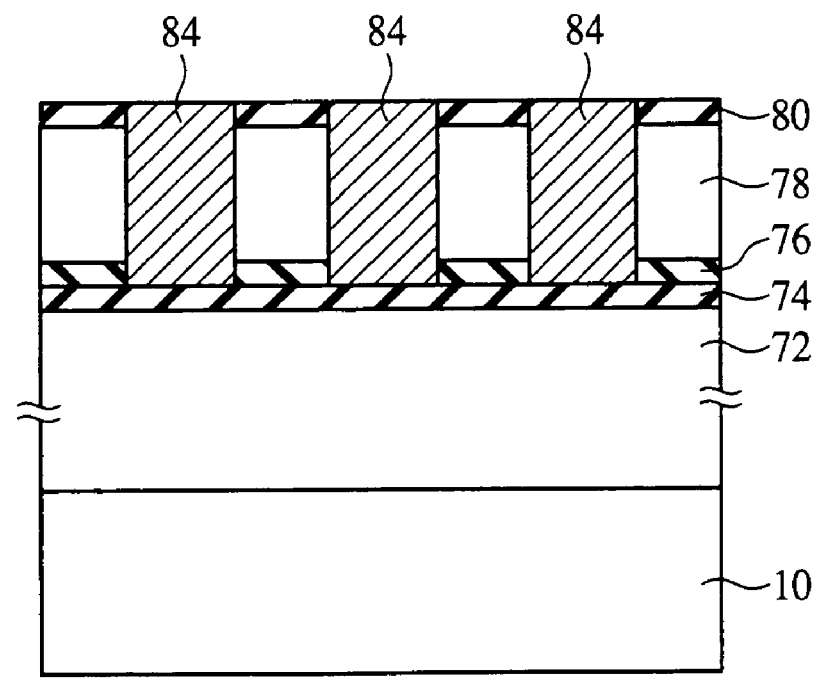
Figure 33:
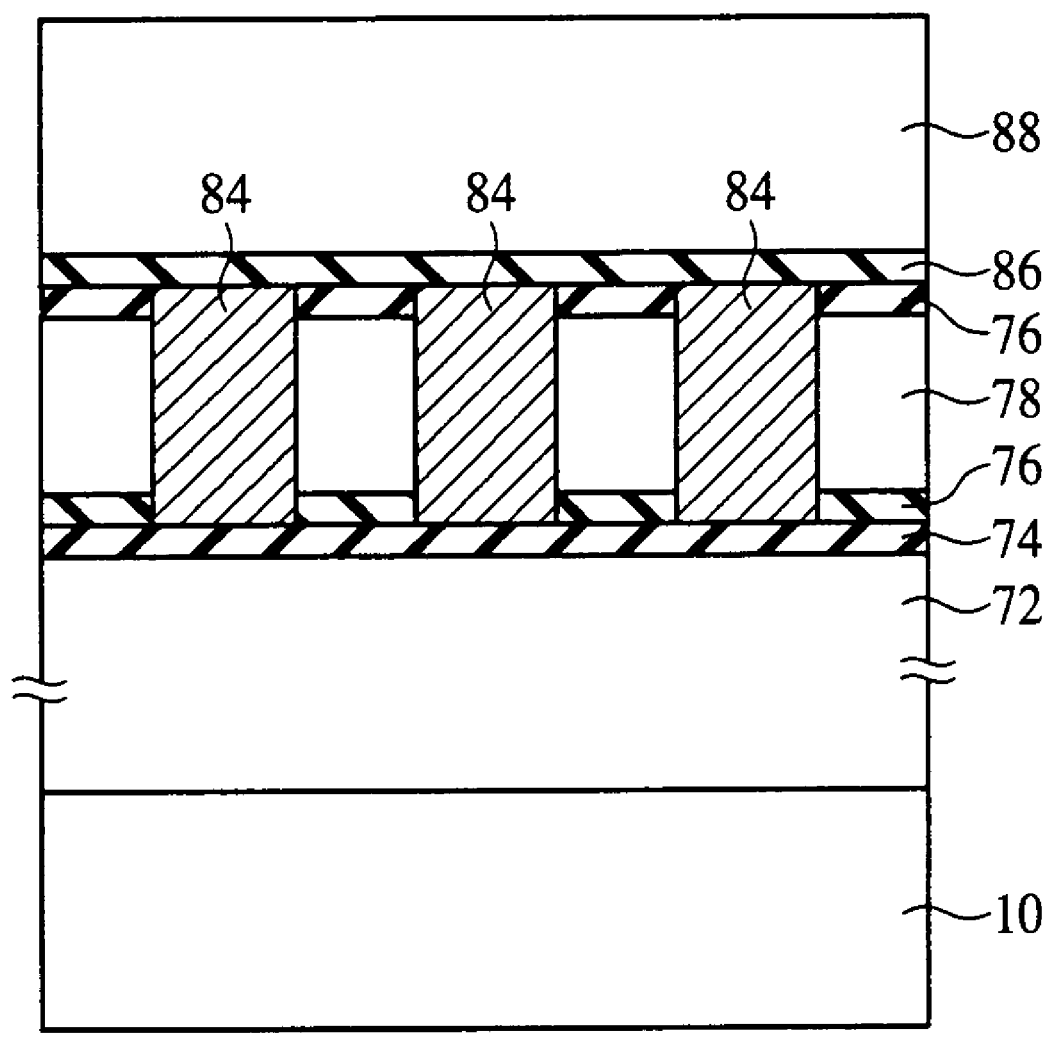
FIG. 33 is a sectional view of a semiconductor device in the steps of the semiconductor device fabrication method according to the fourth embodiment of the present invention, which shows the method (Part 3).

Then, as shown in FIG. 31B, a stopper film 76 of SiN film, an SiCN or an SiOCN film of, e.g., a 30–100 nm-thickness is formed on the entire surface. The stopper film 76 functions as the etching stopper in forming grooves, i.e., trenches for burying interconnections in the inter-layer insulation film 78. When an SiN film is formed as the stopper film 76, the stopper film 76 can be formed in the same way as the silicon nitride film 40a is formed described above with reference to FIG. 24. When an SiCN film is formed as the stopper film 76, the raw material gas can be a raw material gas containing carbon. When an SiOCN film is formed as the stopper film 76, oxygen gas is suitably fed into the film forming chamber.

Next, the inter-layer insulation film 78 is formed of FSG in a 400–800 nm-thickness on the entire surface by, e.g., plasma enhanced CVD.

Then a stopper film 80 is formed of, e.g., a 30–100 nm-thcikness SiN film, SiCN film or SiOCN film on the entire surface. The stopper film 80 functions as the stopper for polishing a conducting film by CMP in a later step which will be described later. When an SiN film is formed as the stopper film 80, the stopper film 80 can be formed in the same way as the silicon nitride film 40a is formed described above with reference to FIG. 24. When an SiCN film is formed as the stopper film 80, the raw material gas can be a raw material gas containing carbon. When an SiOCN film is formed as the stopper film 80, oxygen gas is suitably fed into the film forming chamber.

Then, the stopper film 80 is patterned by photolithography. Then, with the stopper film 80 as the mask and the stopper film 76 as the etching stopper, the inter-layer insulation film 78 is etched. Then, the stopper film 76 in the trenches 82 is etched off. Thus, the trenches 82 for interconnections 84 (refer to FIG. 32A) to be buried in are formed.

Next, a 400–800 nm-thickness copper (Cu) film is formed on the entire surface by, e.g., plating. Then, the copper film is polished by CMP until the surface of the stopper film 80 is exposed. Thus, interconnections 84 of copper are buried in the trenches 82.

Then, a cap film 86 of, e.g., a 30–100 nm-thickness SiN film, SiCN film or SiOCN film on the entire surface. The cap film 86 can be formed in the same way as, for example, the silicon nitride film 40a is formed as described above with reference to FIG. 24.

Then, an inter-layer insulation film 88 of a 400–800 nm-thickness FSG film is formed on the entire surface by, e.g., plasma enhanced CVD.

Thus the semiconductor device is fabricated by the semiconductor device fabrication method according to the present embodiment.

As described above, the semiconductor device fabrication method according to the present embodiment is characterized mainly in that when the cap film and the stopper film of SiN, SiCN or SiOCN are formed of, as described above, a raw material of a compound containing silicon and nitrogen and a raw material of a compound containing a plurality of nitrogen atoms in a molecule are used.

The cap films 74, 86 and the stopper film 76, 80 of SiN, SiCN or SiOCN which are formed after the inter-layer insulation film 72, etc. have been formed must be formed at relatively low film forming temperatures so as to prevent the deformation, deterioration, etc. of the inter-layer insulation film 72, etc. To this end, the cap films and the stopper films of SiN, etc. have been conventionally formed by plasma CVD, which can form films at relatively low temperatures. On the other hand, silicon nitride film used in forming the sidewall spacers have been formed by thermal CVD of high temperatures. Accordingly, it has been impossible to form the cap films and stopper films, and the sidewall spacers by one and the same semiconductor fabricating system. This has been a barrier factor for decreasing the equipment investment and simplifying the fabrication process.

In contrast to this, in the present embodiment, the cap films and stopper films of SiN, SiCN or SiOCN can be formed at relatively low temperatures by thermal CVD or plasma enhanced CVD, which allows the cap films and the stopper film, and the sidewall spacers to be formed by one and the same semiconductor device fabricating system. Thus, the present embodiment can decrease the equipment investment and simplify the process.

[Modified Embodiments]

The present invention is not limited to the above-described embodiments and can cover other various modifications.

For example, in the first and the second embodiments, when the silicon oxide film 38 is formed by thermal CVD, BTBAS and $O_2$ are used as the raw materials, and the film forming temperature is 500–580° C. However, the film forming method for the silicon oxide film 38 is not limited to the above.

For example, the silicon oxide film maybe formed by thermal CVD at a film forming temperature of 560–580° C., using TEOS (Tetra-Ethyl-Ortho-Silicate) and $O_2$. In this case, the pressure in the film forming chamber can be, e.g., 30–100 Pa. The flow rate of the TEOS can be, e.g., 30–130 sccm. The flow rate of the $O_2$ can be, e.g., 0–10 sccm. In this case as well, the silicon oxide film can be formed at relatively low temperatures by thermal CVD.

The silicon oxide film can be formed by thermal CVD at a 600–700° C. film forming temperature for a film forming time of below 15 minutes, using silane and $N_2O$ (nitrous oxide) as the raw materials. In this case, the pressure in the film forming chamber can be 200 Torr. The flow rate of silane can be, e.g., 60 sccm. The flow rate of $N_2O$ can be, e.g., 3000 sccm. In this case, the film forming temperature is higher than the film forming temperatures of the first and the second embodiments, but the short period of the film forming time makes it possible to suppress the diffusion of dopants in the shallow dopant diffused regions and the pocket regions. To make the period of film forming time, single wafer CVD systems, for example, can be used. Unless a single wafer CVD is used, the silicon nitride film can be formed for a short period of film forming time, in a case that the number of the semiconductor substrates is small.

In this specification, the period of film forming time means a time in which a film is actually formed at a prescribed film forming temperature.

The silicon oxide film may be formed by thermal CVD at a 480–500° C. film forming temperature for a film forming time of below 30 minutes, using TEOS and $O_3$ as the raw materials. In this case, the pressure in the film forming chamber can be, e.g., 200 Torr. The flow rate of the TEOS can be, e.g., 600 mg. The low rate of $O_3$ can be, e.g., 4000 sccm. In this case, the film forming temperature is relatively low, and the period of film forming time is short, whereby the diffusion of dopants in the dopant diffused regions and the pockets can be suppressed.

The silicon oxide film may be formed by thermal CVD at a 500–530° C. film forming temperature for a film forming time of below 30 minutes, using disilane and $N_2O$ as the raw materials. In this case, the pressure in the film forming chamber can be, e.g., 200 Torr. The flow rate of the disilane can be, e.g., 20 sccm. The low rate of $N_2O$ can be, e.g., 4500 sccm. In this case, the film forming temperature is relatively low, and the period of film forming time is short, whereby the diffusion of dopants in the dopant diffused regions and the pocket regions can be suppressed.

In the first and the second embodiments, when the silicon nitride film 40 is formed by thermal CVD, BTBAS and $NH_3$ are used as the raw materials, and the film forming temperature is 550–580° C. However, the film forming method for the silicon nitride film is not limited to the above.

For example, the silicon nitride film may be formed by thermal CVD at a 650–700° C. film forming temperature for a period of film forming time of below 15 minutes, using silane and $NH_3$ as the raw materials. In this case, the film forming temperature is a little higher, but the period of film forming time is relative short, whereby the diffusion of dapants in the dopant diffused region forming the shallow region of the extension source/drain and the pocket regions can be suppressed. To make the period of film forming time, single wafer CVD systems, for example, can be used. Unless a single wafer CVD systems is used, the silicon nitride film can be formed for a short period of film forming time, in a case that the number of the semiconductor substrate are small.

In the third and the fourth embodiments, BTBAS is used as a raw material gas of a compound containing silicon and nitrogen, but such raw material is not limited to BTBAS and can be a wide variety of compounds containing silicon and nitrogen.

In the third and the fourth embodiments, hydrazine is used as a raw material of a compound containing a plurality of nitrogen atoms in a molecule, but such raw material is not limited to a hydrazine compound and can be a wide variety of compounds containing a plurality of nitrogen atoms in a molecule. For example, raw materials containing a plurality of nitrogen atoms in a molecule can be exemplified by azido compounds. Azido compounds are, e.g., diethyl azido, dimethyl azido, methyl azide ($CH_3N_3$), ethyl axide ($C_2H_5N_3$), tertiary butyl azido ($C_4H_9N_3$), etc.

In the third and the fourth embodiments, a raw material gas of a hydrazine compound is dimethyl hydrazine, but the hydrazine compound is not limited to dimethyl hydrazine and can be any other hydrazine compound. The hydrazine compounds other than dimethyl hydrazine are exemplified by hydrazine ($N_2H_4$), monomethyl hydrazine (($CH_3$)$_2$ $N_2H_2$), uns-dimethyl hydrazine (($CH_3$)$_2N_2H_2$), sym-dimethyl hydrazine (($CH_3$) $HN_2$ ($CH_3$)H), trimethyl hydrazine (($CH_3$)$_2N_2$ ($CH_3$)H), tetramethey1 hydrazine (($CH_3$)$_2N_2$ ($CH_3$)$_2$), ethylhydrazine (($C_2H_5$)$HN_2H_2$), etc.

In the third embodiment, the silicon nitride film is formed of a raw material gas of a compound containing silicon and nitrogen and a raw material of compound containing a plurality of nitrogen atoms in a molecule, but the insulation film formed of such raw material is not limited to silicon nitride film. For example, SiCN film, SiOCN film, etc. can be formed. By using a raw material gas containing C as a raw material gas, the film forming conditions are suitably set to thereby form SiCN film. By suitably feeding oxygen in the film forming chamber, SiOCN film can be formed.

In the third and the fourth embodiments, after the dopant diffused regions 28, 36 forming the shallow region of the extension source/drain structure and the pocket regions 26, 34 have been formed, the dopant diffused regions 48, 56 forming the deep regions of the extension source/drain structure are formed. However, as in the semiconductor device fabrication method according to the second embodiment, before the dopant diffused regions 28, 36 forming the shallow region of the extension source/drain structure and the pocket regions 26, 34 are formed, the dopant diffused regions 48, 56 forming the deep regions of the extension source/drain structure may be formed.

In the third embodiment, the sidewall spacers are formed of the silicon oxide film 38 and the silicon nitride film 40a. However, the sidewall spacers may be formed of the silicone nitride film 40a alone.

In the fourth embodiment, Cu is used as the material of the interconnections 84. However, the material of the interconnections 84 is not limited to Cu and can be formed suitably of any other wiring material. For example, aluminum (Al) may be used as the wiring material.

In the fourth embodiment, the cap films 74, 86 and the stopper films 76, 80 are formed by thermal CVD but are not essentially formed by thermal CVD. They may be formed suitably by other film forming methods. For example, the cap films 74, 86 and the stopper films 76, 80 may be formed by plasma CVD. When the cap films 74, 86 and the stopper films 76, 80 are formed, the transistors (not shown) are covered by the inter-layer insulation film 72, whereby the cap films 74, 86 and the stopper films 76, 80 can be formed by plasma CVD without affecting the electric characteristics of the transistors.

In the above-described embodiments, after the pocket regions 26, 34 have been formed, the dopant diffused regions 28, 36 forming the shallow regions of the extension source/drain structure is formed, but the pocket regions 26, 34 may be formed after the shallow dopant diffused regions 28, 36 have been formed.

What is claimed is:

1. A method for fabricating a semiconductor device comprising the step of forming an insulation film of SiN or SiCN, using a first raw material of a compound containing at least silicon and nitrogen, and a second raw material of a compound containing a plurality of nitrogen atoms in a molecule excepting $N_2$,
    wherein in the step of forming the insulation film, the insulation film is formed using an additional third raw material of $NH_3$.

2. A method for fabricating a semiconductor device according to claim 1, which further comprises, before the step of forming the insulation film, the steps of:
    forming a gate electrode on a semiconductor substrate with a gate insulation film formed therebetween, and
    implanting a dopant into the semiconductor substrate with the gate electrode as a mask to form dopant diffused regions in the semiconductor substrate on both sides of the gate electrode; and in which
    in the step of forming the insulation film, the insulation film is formed on the semiconductor substrate, covering the gate electrode; and which further comprises, after the step of forming the insulation film, the step of:
    anisotropically etching the insulation film to form a sidewall spacer including the insulation film on the side wall of the gate electrode.

3. A method for fabricating a semiconductor device according to claim 2,
    which further comprises, after the step of forming dopant diffused regions in the semiconductor substrate on both sides of the gate electrode and before the step of forming the insulation film, the step of forming a silicon oxide film on the semiconductor substrate, covering the gate electrode, and
    in which in the step of forming the sidewall spacer, the insulation film and the silicon oxide film are anisotropically etched to form the sidewall spacer including the silicon oxide film and the insulation film on the side wall of the gate electrode.

4. A method for fabricating a semiconductor device according to claim 2, wherein in the step of forming the insulation film, the insulation film is formed by thermal CVD or plasma enhanced CVD.

5. A method for fabricating a semiconductor device according to claim 2, which further comprises, after the step of forming the sidewall spacer, the step of implanting a dopant into the semiconductor substrate with the gate electrode and the sidewall spacer as a mask to form other dopant diffused regions a carrier concentration of which is higher and which are deeper than said dopant diffused regions.

6. A method for fabricating a semiconductor device according to claim 2, which further comprises, after the step of forming the gate electrode and before the step of forming the dopant diffused regions, the steps of:
    forming another sidewall spacer on the side wall of the gate electrode;
    implanting a dopant in the semiconductor substrate with the gate electrode and said another sidewall spacer as a mask to form other dopant diffused regions a carrier concentration of which is higher and which is deeper than said dopant diffused regions; and
    etching off said another sidewall spacer.

7. A method for fabricating a semiconductor device according to claim 2, which further comprises the step of forming pocket regions of a conduction type opposite to that of said dopant diffused regions adjacent to said dopant diffused region after the step of forming a gate electrode and before the step of forming dopant diffused regions, or after the step of forming dopant diffused regions and before the step of forming the insulation film.

8. A method for fabricating a semiconductor device according to claim 2, which further comprises, before the step of forming the insulation film, the steps of:
    forming a transistor on a semiconductor substrate; and
    forming another insulation film on the semiconductor substrate, covering the transistor, and in which
    in the step of forming the insulation film, the insulation film is formed covering said another insulation film.

9. A method for fabricating a semiconductor device according to claim 8, which further comprises, after the step of forming the insulation film, the steps of:
    forming further another insulation film whose etching characteristics are different from those of said insulation film;

forming a trench down to said insulation film in said further another insulation film; and burying an interconnection in the trench.

10. A method for fabricating a semiconductor device according to claim 2, which comprises, before the step of forming the insulation film, the steps of:

forming a transistor on a semiconductor substrate;

forming another insulation film on the semiconductor substrate, covering the transistor; and forming further another insulation film above said another insulation film; and in which in the step of forming the insulation film, said insulation film is formed covering said further another insulation film; and the method further comprises, after the step of forming the insulation film, the steps of:

forming a trench in said insulation film and said further another insulation film;

forming a conducting film in the trench and on said insulation film; and polishing the conducting film until said insulation film is exposed to form an interconnection of the conducting film in the trench.

11. A method for fabricating a semiconductor device according to claim 2, which further comprises, before the step of forming the insulation film, the steps of:

forming a transistor on a semiconductor substrate;

forming another insulation film on the semiconductor substrate, covering the transistor;

forming further another insulation film above said another insulation film; and burying an interconnection in said further another insulation film, and in which in the step of forming the insulation film, the insulation film is formed on said further another insulation film and the interconnection.

12. A method for fabricating a semiconductor device according to claim 2, wherein the first raw material is bis (tertiary-butylamino) silane.

13. A method for fabricating a semiconductor device according to claim 2, wherein the second raw material is a hydrazine compound or an azido compound.

14. A method for fabricating a semiconductor device according to claim 2, wherein in the step of forming the insulation film, the insulation film is formed at a film forming temperature of below 550° C.

15. A method for fabricating a semiconductor device comprising the step of forming an insulation film of SiCN, using a first raw material of a compound containing at least silicon and nitrogen, and a second raw material of a compound containing a plurality of nitrogen atoms in a molecule, excepting $N_2$.

* * * * *